(12) United States Patent
Daneman

(10) Patent No.: US 11,673,165 B2
(45) Date of Patent: *Jun. 13, 2023

(54) ULTRASONIC TRANSDUCER OPERABLE IN A SURFACE ACOUSTIC WAVE (SAW) MODE

(71) Applicant: InvenSense, Inc., San Jose, CA (US)

(72) Inventor: Michael Daneman, Campbell, CA (US)

(73) Assignee: InvenSense, Inc., San Jose, CA (US)

( * ) Notice: Subject to any disclaimer, the term of this patent is extended or adjusted under 35 U.S.C. 154(b) by 1192 days.

This patent is subject to a terminal disclaimer.

(21) Appl. No.: 15/424,703

(22) Filed: Feb. 3, 2017

(65) Prior Publication Data

US 2017/0326590 A1 Nov. 16, 2017

Related U.S. Application Data

(60) Provisional application No. 62/334,413, filed on May 10, 2016.

(51) Int. Cl.
*B06B 1/06* (2006.01)
*H01L 41/18* (2006.01)
(Continued)

(52) U.S. Cl.
CPC .............. *B06B 1/0603* (2013.01); *B06B 1/06* (2013.01); *B06B 1/0622* (2013.01);
(Continued)

(58) Field of Classification Search
CPC ..... B06B 1/064; B06B 1/0292; B06B 1/0622; B06B 2201/55
See application file for complete search history.

(56) References Cited

U.S. PATENT DOCUMENTS 4,880,012 A 11/1989 Sato
5,575,286 A 11/1996 Weng et al.
(Continued)

FOREIGN PATENT DOCUMENTS

CN 1826631 A 8/2006
CN 101192644 A 6/2008
(Continued)

OTHER PUBLICATIONS

ISA/EP, Partial International Search Report for International Application No. PCT/US2019/034032, 8 pages, dated Sep. 12, 2019.
(Continued)

*Primary Examiner* — Shawki S Ismail
*Assistant Examiner* — Karen B Addison

(57) ABSTRACT

A Piezoelectric Micromachined Ultrasonic Transducer (PMUT) device is provided. The PMUT includes a substrate and an edge support structure connected to the substrate. A membrane is connected to the edge support structure such that a cavity is defined between the membrane and the substrate, where the membrane is configured to allow movement at ultrasonic frequencies. The membrane includes a piezoelectric layer and first and second electrodes coupled to opposing sides of the piezoelectric layer. The PMUT is also configured to operate in a Surface Acoustic Wave (SAW) mode. Also provided are an integrated MEMS array, a method for operating an array of PMUT/SAW dual-mode devices, and a PMUT/SAW dual-mode device.

25 Claims, 14 Drawing Sheets

US 11,673,165 B2

Page 2

(51) Int. Cl.
*H10N 30/85* (2023.01)
*H10N 30/87* (2023.01)
*H10N 30/00* (2023.01)
*H01L 41/047* (2006.01)
*H01L 41/08* (2006.01)

(52) U.S. Cl.
CPC .......... *B06B 1/0648* (2013.01); *B06B 1/0651* (2013.01); *H10N 30/1051* (2023.02); *H10N 30/85* (2023.02); *H10N 30/875* (2023.02)

(56) References Cited

U.S. PATENT DOCUMENTS

| | | | |
|---|---|---|---|
| 5,684,243 | A | 11/1997 | Gururaja et al. |
| 5,808,967 | A | 9/1998 | Yu et al. |
| 5,867,302 | A | 2/1999 | Fleming |
| 5,911,692 | A | 6/1999 | Hussain et al. |
| 6,071,239 | A | 6/2000 | Cribbs et al. |
| 6,104,673 | A | 8/2000 | Cole et al. |
| 6,289,112 | B1 | 9/2001 | Jain et al. |
| 6,292,576 | B1 | 9/2001 | Brownlee |
| 6,350,652 | B1 | 2/2002 | Libera et al. |
| 6,428,477 | B1 | 8/2002 | Mason |
| 6,483,932 | B1 | 11/2002 | Martinez et al. |
| 6,500,120 | B1 | 12/2002 | Anthony |
| 6,676,602 | B1 | 1/2004 | Barnes et al. |
| 6,736,779 | B1 | 5/2004 | Sano et al. |
| 7,067,962 | B2 | 6/2006 | Scott |
| 7,109,642 | B2 | 9/2006 | Scott |
| 7,243,547 | B2 | 7/2007 | Cobianu et al. |
| 7,257,241 | B2 | 8/2007 | Lo |
| 7,400,750 | B2 | 7/2008 | Nam |
| 7,433,034 | B1 | 10/2008 | Huang |
| 7,459,836 | B2 | 12/2008 | Scott |
| 7,471,034 | B2 | 12/2008 | Schlote-Holubek et al. |
| 7,489,066 | B2 | 2/2009 | Scott et al. |
| 7,634,117 | B2 | 12/2009 | Cho |
| 7,739,912 | B2 | 6/2010 | Schneider et al. |
| 7,914,454 | B2 | 3/2011 | Weber et al. |
| 8,018,010 | B2 | 9/2011 | Tigli et al. |
| 8,139,827 | B2 | 3/2012 | Schneider et al. |
| 8,255,698 | B2 | 8/2012 | Li et al. |
| 8,311,514 | B2 | 11/2012 | Bandyopadhyay et al. |
| 8,335,356 | B2 | 12/2012 | Schmitt |
| 8,433,110 | B2 | 4/2013 | Kropp et al. |
| 8,508,103 | B2 | 8/2013 | Schmitt et al. |
| 8,515,135 | B2 | 8/2013 | Clarke et al. |
| 8,666,126 | B2 | 3/2014 | Lee et al. |
| 8,703,040 | B2 | 4/2014 | Liufu et al. |
| 8,723,399 | B2 | 5/2014 | Sammoura et al. |
| 8,805,031 | B2 | 8/2014 | Schmitt |
| 9,056,082 | B2 | 6/2015 | Liautaud et al. |
| 9,070,861 | B2 | 6/2015 | Bibl et al. |
| 9,224,030 | B2 | 12/2015 | Du et al. |
| 9,245,165 | B2 | 1/2016 | Slaby et al. |
| 9,424,456 | B1 | 8/2016 | Kamath Koteshwara et al. |
| 9,572,549 | B2 * | 2/2017 | Belevich ............. A61B 8/4477 |
| 9,582,102 | B2 | 2/2017 | Setlak |
| 9,582,705 | B2 | 2/2017 | Du et al. |
| 9,607,203 | B1 | 3/2017 | Yazdandoost et al. |
| 9,607,206 | B2 | 3/2017 | Schmitt et al. |
| 9,613,246 | B1 | 4/2017 | Gozzini et al. |
| 9,618,405 | B2 | 4/2017 | Liu et al. |
| 9,665,763 | B2 | 5/2017 | Du et al. |
| 9,747,488 | B2 | 8/2017 | Yazdandoost et al. |
| 9,785,819 | B1 | 10/2017 | Oreifej |
| 9,815,087 | B2 | 11/2017 | Ganti et al. |
| 9,817,108 | B2 | 11/2017 | Kuo et al. |
| 9,818,020 | B2 | 11/2017 | Schuckers et al. |
| 9,881,195 | B2 | 1/2018 | Lee et al. |
| 9,881,198 | B2 | 1/2018 | Lee et al. |
| 9,898,640 | B2 | 2/2018 | Ghavanini |
| 9,904,836 | B2 | 2/2018 | Yeke Yazdandoost et al. |
| 9,909,225 | B2 | 3/2018 | Lee et al. |
| 9,922,235 | B2 | 3/2018 | Cho et al. |
| 9,933,319 | B2 | 4/2018 | Li et al. |
| 9,934,371 | B2 | 4/2018 | Hong et al. |
| 9,939,972 | B2 | 4/2018 | Shepelev et al. |
| 9,953,205 | B1 | 4/2018 | Rasmussen et al. |
| 9,959,444 | B2 | 5/2018 | Young et al. |
| 9,967,100 | B2 | 5/2018 | Hong et al. |
| 9,983,656 | B2 | 5/2018 | Merrell et al. |
| 9,984,271 | B1 | 5/2018 | King et al. |
| 10,006,824 | B2 | 6/2018 | Tsai et al. |
| 10,080,544 | B2 | 9/2018 | Chiang et al. |
| 10,275,638 | B1 | 4/2019 | Yousefpor et al. |
| 10,315,222 | B2 | 6/2019 | Salvia et al. |
| 10,322,929 | B2 | 6/2019 | Soundara Pandian et al. |
| 10,325,915 | B2 | 6/2019 | Salvia et al. |
| 10,387,704 | B2 | 8/2019 | Dagan et al. |
| 10,445,547 | B2 | 10/2019 | Tsai |
| 10,461,124 | B2 | 10/2019 | Berger et al. |
| 10,478,858 | B2 * | 11/2019 | Lasiter .................. G10K 9/125 |
| 10,488,274 | B2 | 11/2019 | Li et al. |
| 10,497,747 | B2 | 12/2019 | Tsai et al. |
| 10,515,255 | B2 | 12/2019 | Strohmann et al. |
| 10,539,539 | B2 | 1/2020 | Garlepp et al. |
| 10,562,070 | B2 | 2/2020 | Garlepp et al. |
| 10,600,403 | B2 | 3/2020 | Garlepp et al. |
| 10,656,255 | B2 | 5/2020 | Ng et al. |
| 10,670,716 | B2 | 6/2020 | Apte et al. |
| 10,706,835 | B2 | 7/2020 | Garlepp et al. |
| 10,726,231 | B2 | 7/2020 | Tsai et al. |
| 10,755,067 | B2 | 8/2020 | De Foras et al. |
| 11,107,858 | B2 | 8/2021 | Berger et al. |
| 11,301,552 | B2 | 4/2022 | Gurin et al. |
| 2002/0135273 | A1 | 9/2002 | Mauchamp et al. |
| 2003/0013955 | A1 | 1/2003 | Poland |
| 2004/0085858 | A1 | 5/2004 | Khuri-Yakub et al. |
| 2004/0122316 | A1 | 6/2004 | Satoh et al. |
| 2004/0174773 | A1 | 9/2004 | Thomenius et al. |
| 2005/0023937 | A1 | 2/2005 | Sashida et al. |
| 2005/0057284 | A1 | 3/2005 | Wodnicki |
| 2005/0100200 | A1 | 5/2005 | Abiko et al. |
| 2005/0110071 | A1 | 5/2005 | Ema et al. |
| 2005/0146240 | A1 | 7/2005 | Smith et al. |
| 2005/0148132 | A1 | 7/2005 | Wodnicki et al. |
| 2005/0162040 | A1 | 7/2005 | Robert |
| 2006/0052697 | A1 | 3/2006 | Hossack et al. |
| 2006/0079777 | A1 | 4/2006 | Karasawa |
| 2006/0230605 | A1 | 10/2006 | Schlote-Holubek et al. |
| 2006/0280346 | A1 | 12/2006 | Machida |
| 2007/0046396 | A1 | 3/2007 | Huang |
| 2007/0047785 | A1 | 3/2007 | Jang et al. |
| 2007/0073135 | A1 | 3/2007 | Lee et al. |
| 2007/0164632 | A1 | 7/2007 | Adachi et al. |
| 2007/0202252 | A1 | 8/2007 | Sasaki |
| 2007/0215964 | A1 | 9/2007 | Khuri-Yakub et al. |
| 2007/0223791 | A1 | 9/2007 | Shinzaki |
| 2007/0230754 | A1 | 10/2007 | Jain et al. |
| 2008/0125660 | A1 | 5/2008 | Yao et al. |
| 2008/0146938 | A1 | 6/2008 | Hazard et al. |
| 2008/0150032 | A1 | 6/2008 | Tanaka |
| 2008/0194053 | A1 | 8/2008 | Huang |
| 2008/0240523 | A1 | 10/2008 | Benkley et al. |
| 2009/0005684 | A1 | 1/2009 | Kristoffersen et al. |
| 2009/0182237 | A1 | 7/2009 | Angelsen et al. |
| 2009/0232367 | A1 | 9/2009 | Shinzaki |
| 2009/0274343 | A1 | 11/2009 | Clarke |
| 2009/0303838 | A1 | 12/2009 | Svet |
| 2010/0030076 | A1 | 2/2010 | Vortman et al. |
| 2010/0046810 | A1 | 2/2010 | Yamada |
| 2010/0113952 | A1 | 5/2010 | Raguin et al. |
| 2010/0168583 | A1 | 7/2010 | Dausch et al. |
| 2010/0195851 | A1 | 8/2010 | Buccafusca |
| 2010/0201222 | A1 | 8/2010 | Adachi et al. |
| 2010/0202254 | A1 | 8/2010 | Roest et al. |
| 2010/0208004 | A1 | 8/2010 | Ottosson et al. |
| 2010/0239751 | A1 | 9/2010 | Regniere |
| 2010/0251824 | A1 | 10/2010 | Schneider et al. |
| 2010/0256498 | A1 | 10/2010 | Tanaka |
| 2010/0278008 | A1 | 11/2010 | Ammar |
| 2011/0285244 | A1 | 11/2011 | Lewis et al. |
| 2011/0291207 | A1 | 12/2011 | Martin et al. |

(56) References Cited

U.S. PATENT DOCUMENTS

| | | |
|---|---|---|
| 2012/0016604 A1 | 1/2012 | Irving et al. |
| 2012/0092026 A1 | 4/2012 | Liautaud et al. |
| 2012/0095335 A1 | 4/2012 | Sverdlik et al. |
| 2012/0095344 A1 | 4/2012 | Kristoffersen et al. |
| 2012/0095347 A1 | 4/2012 | Adam et al. |
| 2012/0147698 A1 | 6/2012 | Wong et al. |
| 2012/0179044 A1 | 7/2012 | Chiang et al. |
| 2012/0224041 A1 | 9/2012 | Monden |
| 2012/0232396 A1 | 9/2012 | Tanabe |
| 2012/0238876 A1 | 9/2012 | Tanabe et al. |
| 2012/0263355 A1 | 10/2012 | Monden |
| 2012/0279865 A1 | 11/2012 | Regniere et al. |
| 2012/0288641 A1 | 11/2012 | Diatezua et al. |
| 2012/0300988 A1 | 11/2012 | Ivanov et al. |
| 2013/0051179 A1 | 2/2013 | Hong |
| 2013/0064043 A1 | 3/2013 | Degertekin et al. |
| 2013/0127297 A1 | 5/2013 | Bautista et al. |
| 2013/0127592 A1 | 5/2013 | Fyke et al. |
| 2013/0133428 A1 | 5/2013 | Lee et al. |
| 2013/0201134 A1 | 8/2013 | Schneider et al. |
| 2013/0271628 A1 | 10/2013 | Ku et al. |
| 2013/0294201 A1 | 11/2013 | Hajati |
| 2013/0294202 A1 | 11/2013 | Hajati |
| 2014/0060196 A1 | 3/2014 | Falter et al. |
| 2014/0117812 A1 | 5/2014 | Hajati |
| 2014/0176332 A1 | 6/2014 | Alameh et al. |
| 2014/0208853 A1 | 7/2014 | Onishi et al. |
| 2014/0219521 A1 | 8/2014 | Schmitt et al. |
| 2014/0232241 A1 | 8/2014 | Hajati |
| 2014/0265721 A1 | 9/2014 | Robinson et al. |
| 2014/0294262 A1 | 10/2014 | Schuckers et al. |
| 2014/0313007 A1 | 10/2014 | Harding |
| 2014/0355387 A1 | 12/2014 | Kitchens et al. |
| 2015/0036065 A1 | 2/2015 | Yousefpor et al. |
| 2015/0049590 A1 | 2/2015 | Rowe et al. |
| 2015/0087991 A1 | 3/2015 | Chen et al. |
| 2015/0097468 A1 | 4/2015 | Hajati et al. |
| 2015/0105663 A1 | 4/2015 | Kiyose et al. |
| 2015/0145374 A1 | 5/2015 | Xu et al. |
| 2015/0164473 A1 | 6/2015 | Kim et al. |
| 2015/0165479 A1 | 6/2015 | Lasiter et al. |
| 2015/0169136 A1 | 6/2015 | Ganti et al. |
| 2015/0189136 A1 | 7/2015 | Chung et al. |
| 2015/0198699 A1 | 7/2015 | Kuo et al. |
| 2015/0206738 A1 | 7/2015 | Rastegar |
| 2015/0213180 A1 | 7/2015 | Herberholz |
| 2015/0220767 A1 | 8/2015 | Yoon et al. |
| 2015/0241393 A1 | 8/2015 | Ganti et al. |
| 2015/0261261 A1 | 9/2015 | Bhagavatula et al. |
| 2015/0286312 A1 | 10/2015 | Kang et al. |
| 2015/0301653 A1 | 10/2015 | Urushi |
| 2015/0345987 A1 | 12/2015 | Hajati |
| 2015/0357375 A1 | 12/2015 | Tsai et al. |
| 2015/0358740 A1 | 12/2015 | Tsai et al. |
| 2015/0362589 A1 | 12/2015 | Tsai |
| 2015/0371398 A1 | 12/2015 | Qiao et al. |
| 2016/0026840 A1 | 1/2016 | Li et al. |
| 2016/0041047 A1 | 2/2016 | Liu et al. |
| 2016/0051225 A1 | 2/2016 | Kim et al. |
| 2016/0063294 A1 | 3/2016 | Du et al. |
| 2016/0063300 A1 | 3/2016 | Du et al. |
| 2016/0070967 A1 | 3/2016 | Du et al. |
| 2016/0070968 A1 | 3/2016 | Gu et al. |
| 2016/0086010 A1 | 3/2016 | Merrell et al. |
| 2016/0091378 A1 | 3/2016 | Tsai et al. |
| 2016/0092715 A1 | 3/2016 | Yazdandoost et al. |
| 2016/0092716 A1 | 3/2016 | Yazdandoost et al. |
| 2016/0100822 A1 | 4/2016 | Kim et al. |
| 2016/0107194 A1 | 4/2016 | Panchawagh et al. |
| 2016/0117541 A1 | 4/2016 | Lu et al. |
| 2016/0180142 A1 | 6/2016 | Riddle et al. |
| 2016/0296975 A1 | 10/2016 | Lukacs et al. |
| 2016/0299014 A1 | 10/2016 | Li et al. |
| 2016/0326477 A1 | 11/2016 | Fernandez-Alcon et al. |
| 2016/0345930 A1 | 12/2016 | Mizukami et al. |
| 2016/0350573 A1 | 12/2016 | Kitchens et al. |
| 2016/0358003 A1 | 12/2016 | Shen et al. |
| 2017/0004352 A1 | 1/2017 | Jonsson et al. |
| 2017/0330552 A1 | 1/2017 | Garlepp et al. |
| 2017/0032485 A1 | 2/2017 | Vemury |
| 2017/0059380 A1 | 3/2017 | Li et al. |
| 2017/0075700 A1 | 3/2017 | Abudi et al. |
| 2017/0090024 A1 | 3/2017 | Kitchens et al. |
| 2017/0100091 A1 | 4/2017 | Eigil et al. |
| 2017/0110504 A1 | 4/2017 | Panchawagh et al. |
| 2017/0119343 A1 | 5/2017 | Pintoffl |
| 2017/0124374 A1 | 5/2017 | Rowe et al. |
| 2017/0168543 A1 | 6/2017 | Dai et al. |
| 2017/0185821 A1 | 6/2017 | Chen et al. |
| 2017/0194934 A1 | 7/2017 | Shelton et al. |
| 2017/0200054 A1 | 7/2017 | Du et al. |
| 2017/0219536 A1 | 8/2017 | Koch et al. |
| 2017/0231534 A1 | 8/2017 | Agassy et al. |
| 2017/0255338 A1 | 9/2017 | Medina et al. |
| 2017/0293791 A1 | 10/2017 | Mainguet et al. |
| 2017/0316243 A1 | 11/2017 | Ghavanini |
| 2017/0316248 A1 | 11/2017 | He et al. |
| 2017/0322290 A1 | 11/2017 | Ng |
| 2017/0322291 A1 | 11/2017 | Salvia et al. |
| 2017/0322292 A1 | 11/2017 | Salvia et al. |
| 2017/0322305 A1 | 11/2017 | Apte et al. |
| 2017/0323133 A1 | 11/2017 | Tsai |
| 2017/0325081 A1 | 11/2017 | Chrisikos et al. |
| 2017/0326591 A1 | 11/2017 | Apte et al. |
| 2017/0326593 A1 | 11/2017 | Garlepp et al. |
| 2017/0326594 A1 | 11/2017 | Berger et al. |
| 2017/0328866 A1 | 11/2017 | Apte et al. |
| 2017/0328870 A1 | 11/2017 | Garlepp et al. |
| 2017/0330012 A1 | 11/2017 | Salvia et al. |
| 2017/0330553 A1 | 11/2017 | Garlepp et al. |
| 2017/0357839 A1 | 12/2017 | Yazdandoost et al. |
| 2018/0025202 A1 | 1/2018 | Ryshtun et al. |
| 2018/0032788 A1 | 2/2018 | Krenzer et al. |
| 2018/0101711 A1 | 4/2018 | D'Souza et al. |
| 2018/0107852 A1 | 4/2018 | Fenrich et al. |
| 2018/0107854 A1 | 4/2018 | Tsai et al. |
| 2018/0129849 A1 | 5/2018 | Strohmann et al. |
| 2018/0129857 A1 | 5/2018 | Bonev |
| 2018/0178251 A1 | 6/2018 | Foncellino et al. |
| 2018/0206820 A1 | 7/2018 | Anand et al. |
| 2018/0217008 A1 | 8/2018 | Li et al. |
| 2018/0225495 A1 | 8/2018 | Jonsson et al. |
| 2018/0229267 A1 | 8/2018 | Ono et al. |
| 2018/0276443 A1 | 9/2018 | Strohmann et al. |
| 2018/0329560 A1 | 11/2018 | Kim et al. |
| 2018/0349663 A1 | 12/2018 | Garlepp et al. |
| 2018/0357457 A1 | 12/2018 | Rasmussen et al. |
| 2018/0369866 A1 | 12/2018 | Sammoura et al. |
| 2018/0373913 A1 | 12/2018 | Panchawagh et al. |
| 2019/0005300 A1 | 1/2019 | Garlepp et al. |
| 2019/0012673 A1 | 1/2019 | Chakraborty et al. |
| 2019/0018123 A1 | 1/2019 | Narasimha-Iyer et al. |
| 2019/0043920 A1 | 2/2019 | Berger et al. |
| 2019/0046263 A1 | 2/2019 | Hayashida et al. |
| 2019/0057267 A1 | 2/2019 | Kitchens et al. |
| 2019/0073507 A1 | 3/2019 | D'Souza et al. |
| 2019/0087632 A1 | 3/2019 | Raguin et al. |
| 2019/0095015 A1 | 3/2019 | Han et al. |
| 2019/0102046 A1 | 4/2019 | Miranto et al. |
| 2019/0130083 A1 | 5/2019 | Agassy et al. |
| 2019/0171858 A1 | 6/2019 | Ataya et al. |
| 2019/0180069 A1 | 6/2019 | Akhbari et al. |
| 2019/0188441 A1 | 6/2019 | Hall et al. |
| 2019/0188442 A1 | 6/2019 | Flament et al. |
| 2019/0247887 A1 | 8/2019 | Salvia et al. |
| 2019/0325185 A1 | 10/2019 | Tang |
| 2019/0340455 A1 | 11/2019 | Jung et al. |
| 2019/0370518 A1 | 12/2019 | Maor et al. |
| 2020/0030850 A1* | 1/2020 | Apte ............... B06B 1/064 |
| 2020/0050816 A1 | 2/2020 | Tsai |
| 2020/0050817 A1 | 2/2020 | Salvia et al. |
| 2020/0050820 A1 | 2/2020 | Iatsun et al. |
| 2020/0050828 A1 | 2/2020 | Li et al. |
| 2020/0074135 A1 | 3/2020 | Garlepp et al. |

(56) References Cited

U.S. PATENT DOCUMENTS

| | | |
|---|---|---|
| 2020/0111834 A1 | 4/2020 | Tsai et al. |
| 2020/0125710 A1 | 4/2020 | Andersson et al. |
| 2020/0147644 A1 | 5/2020 | Chang |
| 2020/0158694 A1 | 5/2020 | Garlepp et al. |
| 2020/0175143 A1 | 6/2020 | Lee et al. |
| 2020/0194495 A1 | 6/2020 | Berger et al. |
| 2020/0210666 A1 | 7/2020 | Flament |
| 2020/0250393 A1 | 8/2020 | Tsai et al. |
| 2020/0257875 A1 | 8/2020 | Hall et al. |
| 2020/0285882 A1 | 9/2020 | Skovgaard Christensen et al. |
| 2020/0302140 A1 | 9/2020 | Lu et al. |
| 2020/0355824 A1 | 11/2020 | Apte et al. |
| 2020/0400800 A1 | 12/2020 | Ng et al. |
| 2021/0015456 A1 | 1/2021 | Chiang et al. |
| 2021/0161503 A1 | 6/2021 | Mashood et al. |
| 2022/0043144 A1 | 2/2022 | Yanni et al. |

FOREIGN PATENT DOCUMENTS

| | | |
|---|---|---|
| CN | 102159334 A | 8/2011 |
| CN | 104415902 A | 3/2015 |
| CN | 105264542 A | 1/2016 |
| CN | 105378756 A | 3/2016 |
| CN | 106458575 B | 7/2018 |
| CN | 109196671 A | 1/2019 |
| CN | 109255323 A | 1/2019 |
| EP | 1214909 A1 | 6/2002 |
| EP | 2884301 A1 | 6/2015 |
| EP | WO2016007250 * | 1/2016 |
| EP | 3086261 A2 | 10/2016 |
| EP | 1534140 B1 | 1/2019 |
| EP | 3292508 B1 | 12/2020 |
| EP | 3757884 A1 | 12/2020 |
| JP | 2011040467 A | 2/2011 |
| JP | 2014183229 A | 9/2014 |
| KR | 20200090355 A | 7/2020 |
| TW | 201531701 A | 8/2015 |
| WO | 2009096576 A2 | 8/2009 |
| WO | 2009137106 A2 | 11/2009 |
| WO | 2014035564 A1 | 3/2014 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |
| WO | 2015134816 A1 | 9/2015 |
| WO | 2015183945 A1 | 12/2015 |
| WO | 2015193917 A2 | 12/2015 |
| WO | 2016007250 A1 | 1/2016 |
| WO | 2016011172 A1 | 1/2016 |
| WO | 2016022439 A1 | 2/2016 |
| WO | 2016040333 A2 | 3/2016 |
| WO | 2016053587 A1 | 4/2016 |
| WO | 2016061406 A1 | 4/2016 |
| WO | 2016061410 A1 | 4/2016 |
| WO | 2017003848 A1 | 1/2017 |
| WO | 2017053877 A2 | 3/2017 |
| WO | 2017192890 A1 | 11/2017 |
| WO | 2017192895 A1 | 11/2017 |
| WO | 2017192899 A1 | 11/2017 |
| WO | 2017196678 A1 | 11/2017 |
| WO | 2017196682 A1 | 11/2017 |
| WO | 2017192903 A3 | 12/2017 |
| WO | 2018148332 A1 | 8/2018 |
| WO | 2019005487 A1 | 1/2019 |
| WO | 2019164721 A1 | 8/2019 |
| WO | 2020081182 A1 | 4/2020 |

OTHER PUBLICATIONS

ISA/EP, International Search Report and Written Opinion for International Application # PCT/US2018/063431, pp. 1-15, dated Feb. 5, 2019.

ISA/EP, International Search Report and Written Opinion for International Application # PCT/US2019/015020, pp. 1-23, dated Jul. 1, 2019.

ISA/EP, International Search Report and Written Opinion for International Application # PCT/US2019/023440, pp. 1-10, dated Jun. 4, 2019.

ISA/EP, International Search Report and Written Opinion for International Application No. PCT/US2018/037364, 10 pages, dated Sep. 3, 2018.

"Moving Average Filters", Waybackmachine XP05547422, Retrieved from the Internet: URL:https://web.archive.org/web/20170809081353/ https//www.analog.com/media/en/technical-documentation/dsp-book/ dsp_book_Ch15.pdf [retrieved on Jan. 24, 2019], Aug. 9, 2017, 1-8.

"Receiver Thermal Noise Threshold", Fisher Telecommunication Services, Satellite Communications. Retrieved from the Internet: URL:https://web.archive.org/web/20171027075705/http//www. fishercom.xyz:80/satellite-communications/receiver-thermal-noise-threshold.html, Oct. 27, 2017, 3.

"Sleep Mode", Wikipedia, Retrieved from the Internet: URL:https:// web.archive.org/web/20170908153323/https://en.wikipedia.org/wiki/ Sleep_mode [retrieved on Jan. 25, 2019], Sep. 8, 2017, 1-3.

"TMS320C5515 Fingerprint Development Kit (FDK) Hardware Guide", Texas Instruments, Literature No. SPRUFX3, XP055547651, Apr. 2010, 1-26.

"ZTE V7 Max. 5,5" smartphone on MediaTeck Helio P10 cpu; Published on Apr. 20, 2016; https://www.youtube.com/watch?v= ncNCbpkGQzU (Year: 2016).

Cappelli, et al., "Fingerprint Image Reconstruction from Standard Templates", IEEE Transactions on Pattern Analysis and Machine Intelligence, IEEE Computer Society, vol. 29, No. 9, Sep. 2007, 1489-1503.

Feng, et al., "Fingerprint Reconstruction: From Minutiae to Phase", IEEE Transactions on Pattern Analysis and Machine Intelligence, IEEE Computer Society, vol. 33, No. 2, Feb. 2011, 209-223.

Jiang, et al., "Ultrasonic Fingerprint Senseor with Transmit Beamforming Based on a PMUT Array Bonded to CMOS Circuitry", IEEE Transactions on Ultrasonics Ferroelectrics and Frequency Control, Jan. 1, 2017, 1-9.

Kumar, et al., "Towards Contactless, Low-Cost and Accurate 3D Fingerprint Identification", IEEE Transactions on Pattern Analysis and Machine Intelligence, IEEE Computer Society, vol. 37, No. 3, Mar. 2015, 681-696.

Pang, et al., "Extracting Valley-Ridge Lines from Point-Cloud-Based 3D Fingerprint Models", IEEE Computer Graphics and Applications, IEEE Service Center, New York, vol. 33, No. 4, Jul./Aug. 2013, 73-81.

Papageorgiou, et al., "Self-Calibration of Ultrasonic Transducers in an Intelligent Data Acquisition System", International Scientific Journal of Computing, 2003, vol. 2, Issue 2 Retrieved Online: URL: https://scholar.google.com/scholar?q=self-calibration+of+ultrasoni c+transducers+in+an+intelligent+data+acquisition+system&hl=en &as_sdt=0&as_vis=1&oi=scholart, 2003, 9-15.

Ross, et al., "From Template to Image: Reconstructing Fingerprints from Minutiae Points", IEEE Transactions on Pattern Analysis and Machine Intelligence, IEEE Computer Society, vol. 29, No. 4, Apr. 2007, 544-560.

Zhou, et al., "Partial Fingerprint Reconstruction with Improved Smooth Extension", Network and System Security, Springer Berlin Heidelberg, Jun. 3, 2013, 756-762.

ISA/EP, International Search Report and Written Opinion for International Application No. PCT/US2017/031140, 18 pages, dated Nov. 2, 2017 (dated Nov. 2, 2017).

ISA/EP, International Search Report for International Application No. PCT/US2017/031826, 16 pages, dated Feb. 27, 2018 (dated Feb. 27, 2018).

ISA/EP, Partial International Search Report for International Application No. PCT/US2017/031823, 12 pages, dated Nov. 30, 2017 (dated Nov. 30, 2017).

Tang, et al., "Pulse-Echo Ultrasonic Fingerprint Sensor on a Chip", IEEE Transducers, Anchorage, Alaska, USA, Jun. 21-25, 2015, pp. 674-677.

(56) References Cited

OTHER PUBLICATIONS

Dausch, et al., "Theory and Operation of 2-D Array Piezoelectric Micromachined Ultrasound Transducers", IEEE Transactions on Ultrasonics, and Frequency Control, vol. 55, No. 11;, Nov. 2008, 2484-2492.
Hopcroft, et al., "Temperature Compensation of a MEMS Resonator Using Quality Factor as a Thermometer", Retrieved from Internet: http://micromachine.stanford.edu/~amanu/linked/MAH_MEMS2006.pdf, 2006, 222-225.
Hopcroft, et al., "Using the temperature dependence of resonator quality factor as a thermometer", Applied Physics Letters 91. Retrieved from Internet: http://micromachine.stanford.edu/~hopcroft/Publications/Hopcroft_QT_ApplPhysLett_91_013505.pdf, 2007, 013505-1-031505-3.
Lee, et al., "Low jitter and temperature stable MEMS oscillators", Frequency Control Symposium (FCS), 2012 IEEE International, May 2012, 1-5.
Li, et al., "Capacitive micromachined ultrasonic transducer for ultra-low pressure measurement: Theoretical study", AIP Advances 5.12. Retrieved from Internet: http://scitation.aip.org/content/aip/journal/adva/5/12/10.1063/1.4939217, 2015, 127231.
Qiu, et al., "Piezoelectric Micromachined Ultrasound Transducer (PMUT) Arrays for Integrated Sensing, Actuation and Imaging", Sensors 15, doi:10.3390/s150408020, Apr. 3, 2015, 8020-8041.
Savoia, et al., "Design and Fabrication of a cMUT Probe for Ultrasound Imaging of Fingerprints", 2010 IEEE International Ultrasonics Symposium Proceedings, Oct. 2010, 1877-1880.
Shen, et al., "Anisotropic Complementary Acoustic Metamaterial for Canceling out Aberrating Layers", American Physical Society, Physical Review X 4.4: 041033., Nov. 19, 2014, 041033-1-041033-7.
Thakar, et al., "Multi-resonator approach to eliminating the temperature dependence of silicon-based timing references", Hilton Head'14. Retrieved from the Internet: http://blog.narotama.ac.id/wp-content/uploads/2014/12/Multi-resonator-approach-to-eliminating-the-temperature-dependance-of-silicon-based-timing-references.pdf, 2014, 415-418.
ISA/EP, International Search Report and Written Opinion for International Application No. PCT/US2017/031120, 12 pages, dated Aug. 29, 2017 (dated Aug. 29, 2017).
ISA/EP, International Search Report and Written Opinion for International Application No. PCT/US2017/031120, 13 pages, dated Sep. 1, 2017 (dated Sep. 1, 2017).
ISA/EP, International Search Report and Written Opinion for International Application No. PCT/US2017/031134, 12 pages, dated Aug. 30, 2017 (dated Aug. 30, 2017).
ISA/EP, International Search Report and Written Opinion for International Application No. PCT/US2017/031421 13 pages, dated Jun. 21, 2017 (dated Jun. 21, 2017).
ISA/EP, International Search Report and Written Opinion for International Application No. PCT/US2017/031426 13 pages, dated Jun. 22, 2017 (dated Jun. 22, 2017).
ISA/EP, International Search Report and Written Opinion for International Application No. PCT/US2017/031431, 14 pages, dated Aug. 1, 2017 (dated Aug. 1, 2017).
ISA/EP, International Search Report and Written Opinion for International Application No. PCT/US2017/031434, 13 pages, dated Jun. 26, 2017 (dated Jun. 26, 2017).
ISA/EP, International Search Report and Written Opinion for International Application No. PCT/US2017/031439, 10 pages, dated Jun. 20, 2017 (dated Jun. 20, 2017).
ISA/EP, International Search Report and Written Opinion for International Application No. PCT/US2017/031824, 18 pages, dated Sep. 22, 2017 (dated Sep. 22, 2017).
ISA/EP, International Search Report and Written Opinion for International Application No. PCT/US2017/031827, 16 pages, dated Aug. 1, 2017 (dated Aug. 1, 2017).
ISA/EP, International Search Report and Written Opinion for International Application No. PCT/US2017/031831, 12 pages, dated Jul. 21, 2017 (dated Jul. 21, 2017).
ISA/EP, Partial International Search Report for International Application No. PCT/US2017/031140, 13 pages, dated Aug. 29, 2017 (dated Aug. 29, 2017).
Rozen, et al., "Air-Coupled Aluminum Nitride Piezoelectric Micromachined Ultrasonic Transducers at 0.3 MHZ to 0.9 MHZ", 2015 28th IEEE International Conference on Micro Electro Mechanical Systems (MEMS), IEEE, Jan. 18, 2015, 921-924.
Office Action for CN App No. 201780029016.7 dated Mar. 24, 2020, 7 pages.
EP Office Action, for Application 17724184.1, dated Oct. 12, 2021, 6 pages.
EP Office Action, dated Oct. 9, 2021, 6 pages.
European Patent Office, Office Action, App 17725018, pp. 5, dated Oct. 25, 2021.
European Patent Office, Office Action, App 17725020.6, pp. 4, dated Oct. 25, 2021.
Tang, et al., "Pulse-echo ultrasonic fingerprint sensor on a chip", 2015 Transducers, 2015 18th International Conference on Solid-State Sensors, Actuators and Microsystems, Apr. 1, 2015, 674-677.
ISA/EP, International Search Report and Written Opinion for International Application No. PCT/US2020/042427, 18 pages, dated Dec. 14, 2020.
ISA/EP, International Search Report and Written Opinion for International Application No. PCT/US2020/033854, 16 pages, dated Nov. 3, 2020.
ISA/EP, International Search Report and Written Opinion for International Application No. PCT/US2020/039208, 10 pages, dated Oct. 9, 2020.
ISA/EP, International Search Report and Written Opinion for International Application No. PCT/US2020/039452, 11 pages, dated Sep. 9, 2020.
ISA/EP, Partial Search Report and Provisional Opinion for International Application No. PCT/US2020/042427, 13 pages, dated Oct. 26, 2020.
ISA/EP, Partial Search Report for International Application No. PCT/US2020/033854, 10 pages, dated Sep. 8, 2020.
Office Action for CN App No. 201780029016.7 dated Sep. 25, 2020, 7 pages.
Tang, et al., "11.2 3D Ultrasonic Fingerprint Sensor-on-a-Chip", 2016 IEEE International Solid-State Circuits Conference, IEEE, Jan. 31, 2016, 202-203.
ISA/EP, International Search Report and Written Opinion for International Application No. PCT/US2019061516, 14 pages, dated Mar. 12, 2020.
ISA/EP, International Search Report and Written Opinion for International Application No. PCT/US2021/021412, 12 pages, dated Jun. 9, 2021.
Taiwan Application No. 106114623, 1st Office Action, dated Aug. 5, 2021, pp. 1-8.
EP Office Action, for Application 17725017.2 dated Feb. 25, 2022, 7 pages.
Office Action for CN App No. 201780027435.7 dated Sep. 10, 2022, 9 pages.
Office Action for CN App No. 201780028685.2 dated Dec. 5, 2022, 11 pages.
Office Action for CN App No. 201780027434.2 dated Oct. 21, 2022, 10 pages.
Office Action for CN App No. 201780027444.6 dated Dec. 2, 2022, 17 pages.
Office Action for CN App No. 201780029058.0 dated Dec. 2, 2022, 9 pages.
Office Action for CN App No. 201780029059.5 dated Nov. 11, 2022, 11 pages.

* cited by examiner

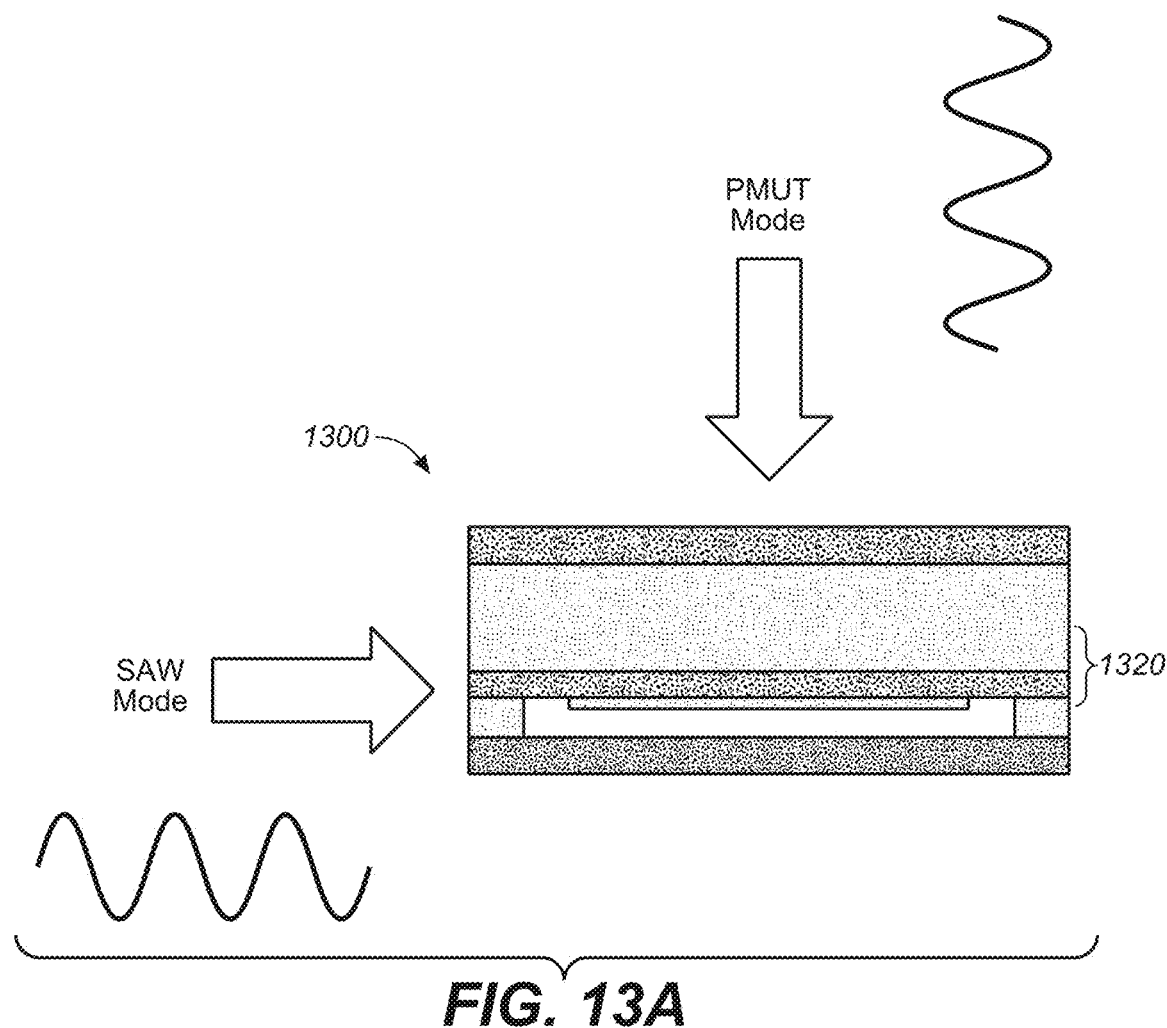
FIG. 13A
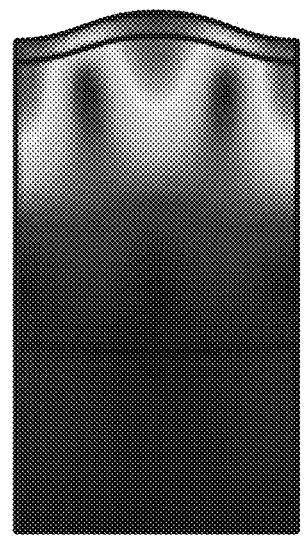 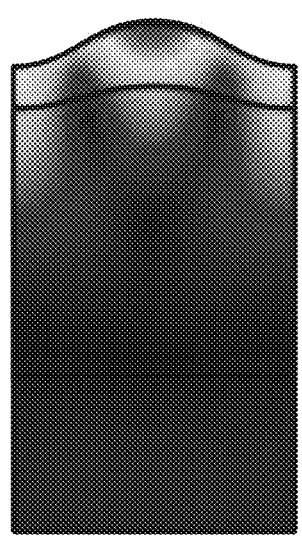
FIG. 13B   FIG. 13C

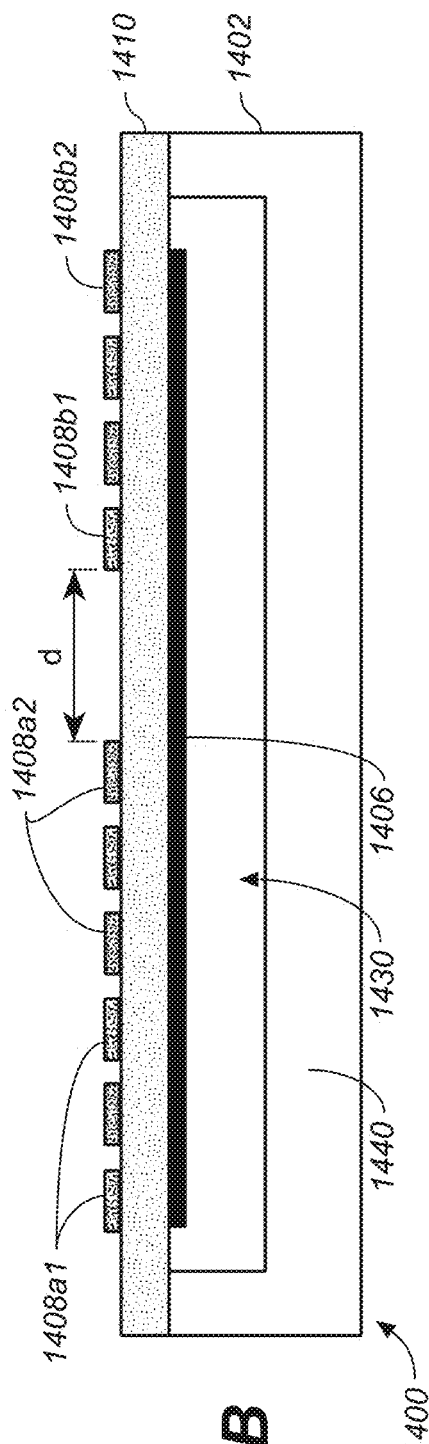
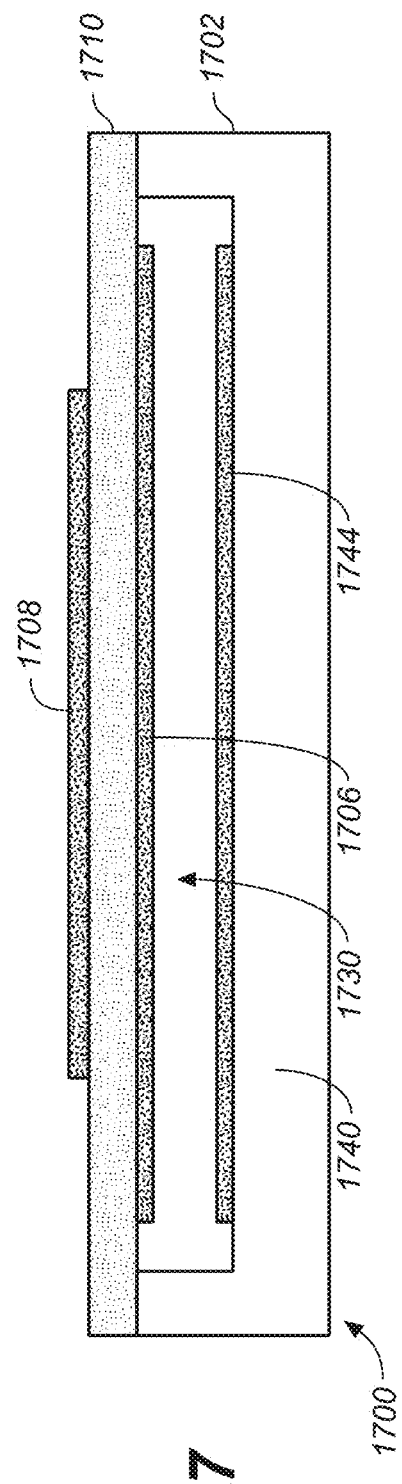

ULTRASONIC TRANSDUCER OPERABLE IN A SURFACE ACOUSTIC WAVE (SAW) MODE

RELATED APPLICATIONS

This application claims priority to and the benefit of U.S. Patent Provisional Patent Application 62/334,413, filed on May 10, 2016, entitled "SUPPLEMENTAL SENSOR MODES AND SYSTEMS FOR ULTRASONIC TRANSDUCERS," by Michael Daneman, and assigned to the assignee of the present application, which is incorporated herein by reference in its entirety.

BACKGROUND

Piezoelectric materials facilitate conversion between mechanical energy and electrical energy. Moreover, a piezoelectric material can generate an electrical signal when subjected to mechanical stress, and can vibrate when subjected to an electrical voltage. Piezoelectric materials are widely utilized in piezoelectric ultrasonic transducers to generate acoustic waves based on an actuation voltage applied to electrodes of the piezoelectric ultrasonic transducer.

BRIEF DESCRIPTION OF THE DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIGS. 13A-C illustrate an embodiment of a device operating in a Surface Acoustic Wave (SAW) mode.

FIGS. 14A-14B illustrate, in top plan view (FIG. 14A) and a side cross-sectional view (FIG. 14B), an embodiment of a dual-mode device structure for operating in switchable PMUT/SAW modes.

FIG. 17 illustrates, in a side cross-sectional view, an embodiment of a device structure for operating in switchable PMUT/CMUT modes.

DESCRIPTION OF EMBODIMENTS

Figure 1A:
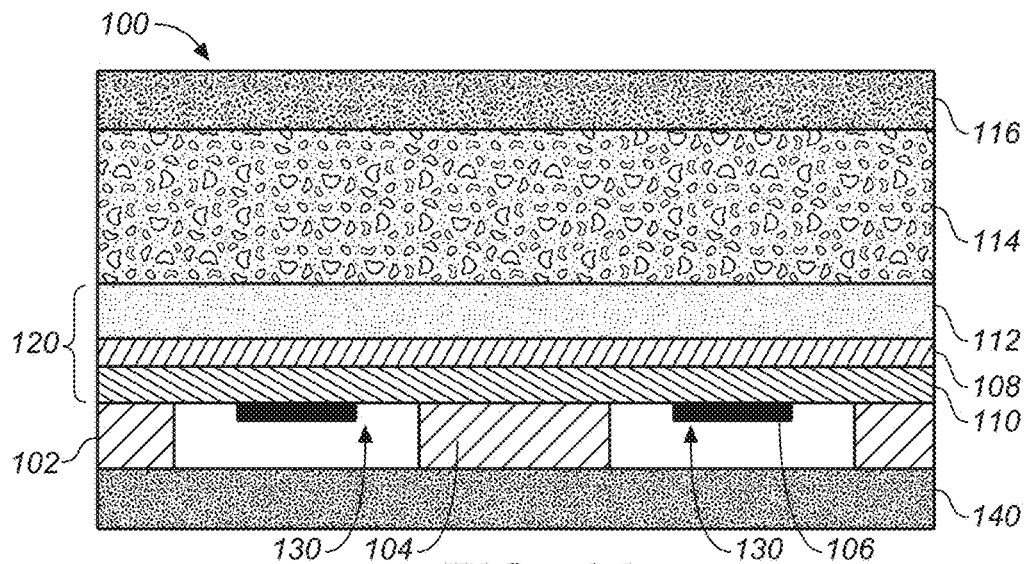
FIG. 1A is a diagram illustrating a piezoelectric micromachined ultrasonic transducer (PMUT) device having a center pinned membrane, according to some embodiments.

The following Description of Embodiments is merely provided by way of example and not of limitation. Furthermore, there is no intention to be bound by any expressed or implied theory presented in the preceding background or in the following Description of Embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

NOTATION AND NOMENCLATURE

Some portions of the detailed descriptions which follow are presented in terms of procedures, logic blocks, processing and other symbolic representations of operations on data within an electrical device. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of acoustic (e.g., ultrasonic) signals capable of being transmitted and received by an electronic device and/or electrical or magnetic signals capable of being stored, transferred, combined, compared, and otherwise manipulated in an electrical device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "transmitting," "receiving," "sensing," "generating," "imaging," or the like, refer to the actions and processes of an electronic device such as an electrical device.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, logic, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example systems described herein may include components other than those shown, including well-known components.

Various techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

Various embodiments described herein may be executed by one or more processors, such as one or more motion processing units (MPUs), sensor processing units (SPUs), host processor(s) or core(s) thereof, digital signal processors (DSPs), general purpose microprocessors, application specific integrated circuits (ASICs), application specific instruction set processors (ASIPs), field programmable gate arrays (FPGAs), a programmable logic controller (PLC), a complex programmable logic device (CPLD), a discrete gate or transistor logic, discrete hardware components, or any combination thereof designed to perform the functions described herein, or other equivalent integrated or discrete logic circuitry. The term "processor," as used herein may refer to any of the foregoing structures or any other structure suitable for implementation of the techniques described herein. As is employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Moreover, processors can exploit nano-scale architectures such as, but not limited to, molecular and quantum-dot based transistors, switches and gates, in order to optimize space usage or enhance performance of user equipment. A processor may also be implemented as a combination of computing processing units.

In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU/MPU and a microprocessor, a plurality of microprocessors, one or more microprocessors in conjunction with an SPU core, MPU core, or any other such configuration.

Overview of Discussion

Discussion begins with a description of an example Piezoelectric Micromachined Ultrasonic Transducer (PMUT), in accordance with various embodiments. Example arrays including PMUT devices are then described. Example operations of the example arrays of PMUT devices are then further described. Further, dual-mode PMUT/Surface Acoustic Wave (SAW) and PMUT/Capacitive Micromachined Ultrasonic Transducer (CMUT) devices and arrays of such devices are also described.

A conventional piezoelectric ultrasonic transducer able to generate and detect pressure waves can include a membrane with the piezoelectric material, a supporting layer, and electrodes combined with a cavity beneath the electrodes. Miniaturized versions are referred to as PMUTs. Typical PMUTs use an edge anchored membrane or diaphragm that maximally oscillates at or near the center of the membrane at a resonant frequency (f) proportional to $h/a^2$, where h is the thickness, and a is the radius of the membrane. Higher frequency membrane oscillations can be created by increasing the membrane thickness, decreasing the membrane radius, or both. Increasing the membrane thickness has its limits, as the increased thickness limits the displacement of the membrane. Reducing the PMUT membrane radius also has limits, because a larger percentage of PMUT membrane area is used for edge anchoring.

Embodiments describes herein relate to a PMUT device for ultrasonic wave generation and sensing. In accordance with various embodiments, an array of such PMUT devices is described. The PMUT includes a substrate and an edge support structure connected to the substrate. A membrane is connected to the edge support structure such that a cavity is defined between the membrane and the substrate, where the membrane is configured to allow movement at ultrasonic frequencies. The membrane includes a piezoelectric layer and first and second electrodes coupled to opposing sides of the piezoelectric layer. An interior support structure is disposed within the cavity and connected to the substrate and the membrane.

The described PMUT device and array of PMUT devices can be used for generation of acoustic signals or measurement of acoustically sensed data in various applications, such as, but not limited to, medical applications, security systems, biometric systems (e.g., fingerprint sensors and/or motion/gesture recognition sensors), mobile communication systems, industrial automation systems, consumer electronic devices, robotics, etc. In one embodiment, the PMUT device can facilitate ultrasonic signal generation and sensing (transducer). Moreover, embodiments describe herein provide a sensing component including a silicon wafer having a two-dimensional (or one-dimensional) array of ultrasonic transducers.

Embodiments described herein provide a PMUT that operates at a high frequency for reduced acoustic diffraction through high acoustic velocity materials (e.g., glass, metal), and for shorter pulses so that spurious reflections can be time-gated out. Embodiments described herein also provide a PMUT that has a low quality factor providing a shorter ring-up and ring-down time to allow better rejection of spurious reflections by time-gating. Embodiments described herein also provide a PMUT that has a high fill-factor providing for large transmit and receive signals.

Piezoelectric Micromachined Ultrasonic Transducer (PMUT)

Systems and methods disclosed herein, in one or more aspects provide efficient structures for an acoustic transducer (e.g., a piezoelectric actuated transducer or PMUT). One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and devices are shown in block diagram form in order to facilitate describing the embodiments in additional detail.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the word "example" is used herein to mean serving as an example, instance, or illustration.

FIG. 1A is a diagram illustrating a PMUT device 100 having a center pinned membrane, according to some embodiments. PMUT device 100 includes an interior pinned membrane 120 positioned over a substrate 140 to define a cavity 130. In one embodiment, membrane 120 is attached both to a surrounding edge support 102 and interior support 104. In one embodiment, edge support 102 is connected to an electric potential. Edge support 102 and interior support 104 may be made of electrically conducting materials, such as and without limitation, aluminum, molybdenum, or titanium. Edge support 102 and interior support 104 may also be made of dielectric materials, such as silicon dioxide, silicon nitride or aluminum oxide that have electrical connections the sides or in vias through edge support 102 or interior support 104, electrically coupling lower electrode 106 to electrical wiring in substrate 140.

In one embodiment, both edge support 102 and interior support 104 are attached to a substrate 140. In various embodiments, substrate 140 may include at least one of, and without limitation, silicon or silicon nitride. It should be appreciated that substrate 140 may include electrical wirings and connection, such as aluminum or copper. In one embodiment, substrate 140 includes a CMOS logic wafer bonded to edge support 102 and interior support 104. In one embodiment, the membrane 120 comprises multiple layers. In an example embodiment, the membrane 120 includes lower electrode 106, piezoelectric layer 110, and upper electrode 108, where lower electrode 106 and upper electrode 108 are coupled to opposing sides of piezoelectric layer 110. As shown, lower electrode 106 is coupled to a lower surface of piezoelectric layer 110 and upper electrode 108 is coupled to an upper surface of piezoelectric layer 110. It should be appreciated that, in various embodiments, PMUT device 100 is a microelectromechanical (MEMS) device.

In one embodiment, membrane 120 also includes a mechanical support layer 112 (e.g., stiffening layer) to mechanically stiffen the layers. In various embodiments, mechanical support layer 140 may include at least one of, and without limitation, silicon, silicon oxide, silicon nitride, aluminum, molybdenum, titanium, etc. In one embodiment, PMUT device 100 also includes an acoustic coupling layer 114 above membrane 120 for supporting transmission of acoustic signals. It should be appreciated that acoustic coupling layer can include air, liquid, gel-like materials, or other materials for supporting transmission of acoustic signals. In one embodiment, PMUT device 100 also includes platen layer 116 above acoustic coupling layer 114 for containing acoustic coupling layer 114 and providing a contact surface for a finger or other sensed object with PMUT device 100. It should be appreciated that, in various embodiments, acoustic coupling layer 114 provides a contact surface, such that platen layer 116 is optional. Moreover, it should be appreciated that acoustic coupling layer 114 and/or platen layer 116 may be included with or used in conjunction with multiple PMUT devices. For example, an array of PMUT devices may be coupled with a single acoustic coupling layer 114 and/or platen layer 116.

Figure 1B:
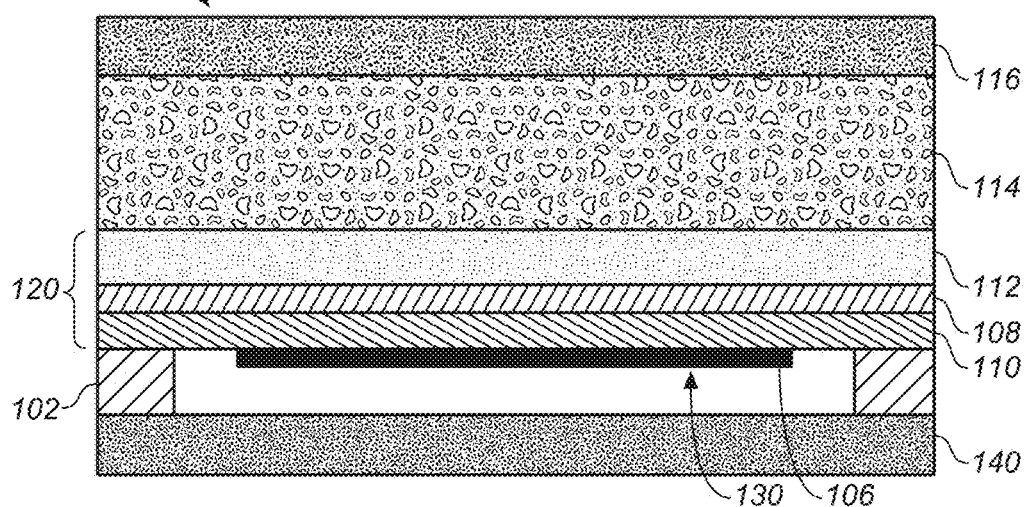
FIG. 1B is a diagram illustrating a PMUT device having an unpinned membrane, according to some embodiments.

FIG. 1B is identical to FIG. 1A in every way, except that the PMUT device 100' of FIG. 1B omits the interior support 104 and thus membrane 120 is not pinned (e.g., is "unpinned"). There may be instances in which an unpinned membrane 120 is desired. However, in other instances, a pinned membrane 120 may be employed.

Figure 2:
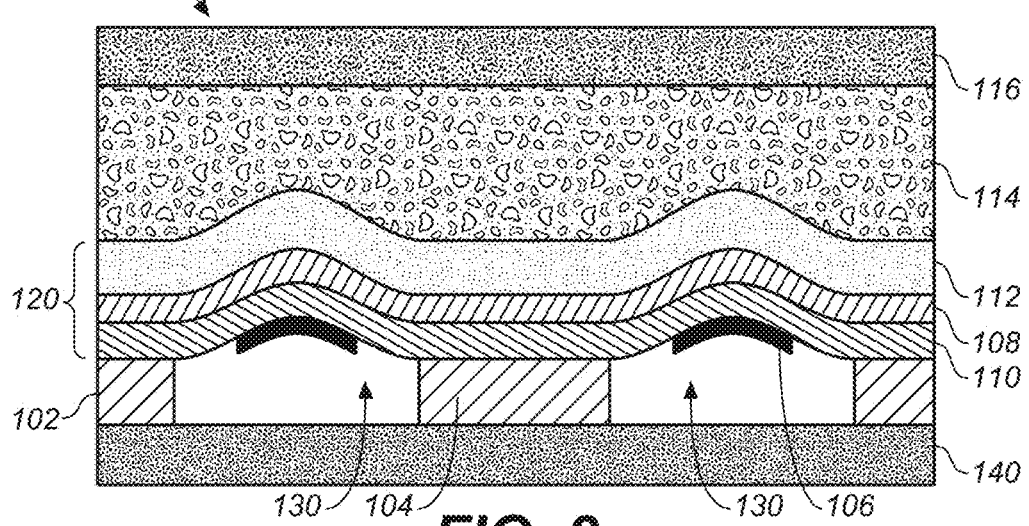
FIG. 2 is a diagram illustrating an example of membrane movement during activation of a PMUT device having a center pinned membrane, according to some embodiments.

FIG. 2 is a diagram illustrating an example of membrane movement during activation of pinned PMUT device 100, according to some embodiments. As illustrated with respect to FIG. 2, in operation, responsive to an object proximate platen layer 116, the electrodes 106 and 108 deliver a high frequency electric charge to the piezoelectric layer 110, causing those portions of the membrane 120 not pinned to the surrounding edge support 102 or interior support 104 to be displaced upward into the acoustic coupling layer 114. This generates a pressure wave that can be used for signal probing of the object. Return echoes can be detected as pressure waves causing movement of the membrane, with compression of the piezoelectric material in the membrane causing an electrical signal proportional to amplitude of the pressure wave.

The described PMUT device 100 can be used with almost any electrical device that converts a pressure wave into mechanical vibrations and/or electrical signals. In one aspect, the PMUT device 100 can comprise an acoustic sensing element (e.g., a piezoelectric element) that generates and senses ultrasonic sound waves. An object in a path of the generated sound waves can create a disturbance (e.g., changes in frequency or phase, reflection signal, echoes, etc.) that can then be sensed. The interference can be analyzed to determine physical parameters such as (but not limited to) distance, density and/or speed of the object. As an example, the PMUT device 100 can be utilized in various applications, such as, but not limited to, fingerprint or physiologic sensors suitable for wireless devices, industrial systems, automotive systems, robotics, telecommunications, security, medical devices, etc. For example, the PMUT device 100 can be part of a sensor array comprising a plurality of ultrasonic transducers deposited on a wafer, along with various logic, control and communication electronics. A sensor array may comprise homogenous or identical PMUT devices 100, or a number of different or heterogonous device structures.

In various embodiments, the PMUT device 100 employs a piezoelectric layer 110, comprised of materials such as, but not limited to, aluminum nitride (AlN), lead zirconate titanate (PZT), quartz, polyvinylidene fluoride (PVDF), and/or zinc oxide, to facilitate both acoustic signal production and sensing. The piezoelectric layer 110 can generate electric charges under mechanical stress and conversely experience a mechanical strain in the presence of an electric field. For example, the piezoelectric layer 110 can sense mechanical vibrations caused by an ultrasonic signal and produce an electrical charge at the frequency (e.g., ultrasonic frequency) of the vibrations. Additionally, the piezoelectric layer 110 can generate an ultrasonic wave by vibrating in an oscillatory fashion that might be at the same frequency (e.g., ultrasonic frequency) as an input current generated by an alternating current (AC) voltage applied across the piezoelectric layer 110. It should be appreciated that the piezoelectric layer 110 can include almost any material (or combination of materials) that exhibits piezoelectric properties, such that the structure of the material does not have a center of symmetry and a tensile or compressive stress applied to the material alters the separation between positive and negative charge sites in a cell causing a polarization at the surface of the material. The polarization is directly proportional to the applied stress and is direction dependent so that compressive and tensile stresses results in electric fields of opposite polarizations.

Figure 10:
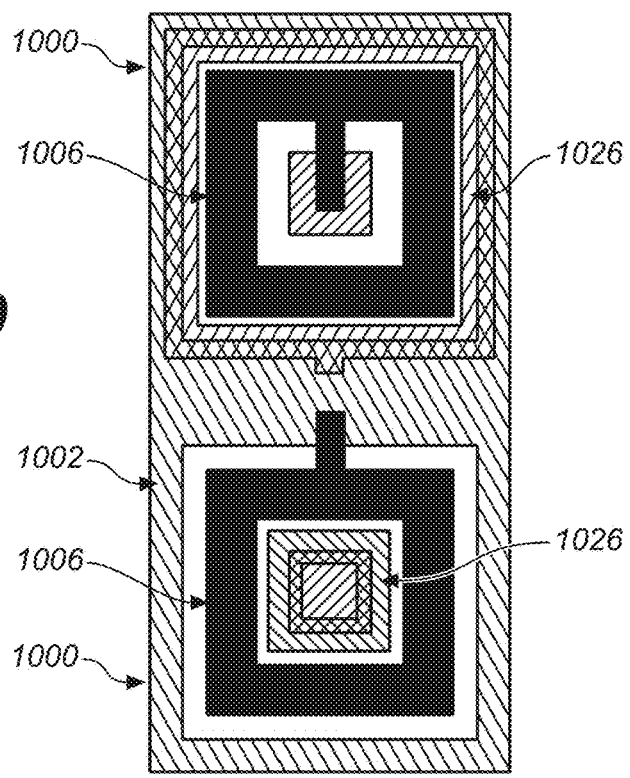
FIG. 10 illustrates an example pair of PMUT devices in a PMUT array, with each PMUT having differing electrode patterning, according to some embodiments.

Further, the PMUT device 100 comprises electrodes 106 and 108 that supply and/or collect the electrical charge to/from the piezoelectric layer 110. It should be appreciated that electrodes 106 and 108 can be continuous and/or patterned electrodes (e.g., in a continuous layer and/or a patterned layer). For example, as illustrated, electrode 106 is a patterned electrode and electrode 108 is a continuous electrode. As an example, electrodes 106 and 108 can be comprised of almost any metal layers, such as, but not limited to, aluminum (Al)/titanium (Ti), molybdenum (Mo), etc., which are coupled with an on opposing sides of the piezoelectric layer 110. In one embodiment, PMUT device also includes a third electrode, as illustrated in FIG. 10 and described below.

According to an embodiment, the acoustic impedance of acoustic coupling layer 114 is selected to be similar to the acoustic impedance of the platen layer 116, such that the acoustic wave is efficiently propagated to/from the membrane 120 through acoustic coupling layer 114 and platen layer 116. As an example, the platen layer 116 can comprise various materials having an acoustic impedance in the range between 0.8 to 4 Mega Rayleigh (MRayl), such as, but not limited to, plastic, resin, rubber, Teflon, epoxy, etc. In another example, the platen layer 116 can comprise various materials having a high acoustic impedance (e.g., an acoustic impedance greater than 10 MRayl), such as, but not limited to, glass, aluminum-based alloys, sapphire, etc. Typically, the platen layer 116 can be selected based on an application of the sensor. For instance, in fingerprinting applications, platen layer 116 can have an acoustic impedance that matches (e.g., exactly or approximately) the acoustic impedance of human skin (e.g., $1.6 \times 10^6$ Rayl). Further, in one aspect, the platen layer 116 can further include a thin layer of anti-scratch material. In various embodiments, the anti-scratch layer of the platen layer 116 is less than the wavelength of the acoustic wave that is to be generated and/or sensed to provide minimum interference during propagation of the acoustic wave. As an example, the anti-scratch layer can comprise various hard and scratch-resistant materials (e.g., having a Mohs hardness of over 7 on the Mohs scale), such as, but not limited to sapphire, glass, titanium nitride (TiN), silicon carbide (SiC), diamond, etc. As an example, PMUT device 100 can operate at 20 MHz and accordingly, the wavelength of the acoustic wave propagating through the acoustic coupling layer 114 and platen layer 116 can be 70-150 microns. In this example scenario, insertion loss can be reduced and acoustic wave propagation efficiency can be improved by utilizing an anti-scratch layer having a thickness of 1 micron and the platen layer 116 as a whole having a thickness of 1-2 millimeters. It is noted that the term "anti-scratch material" as used herein relates to a material that is resistant to scratches and/or scratch-proof and provides substantial protection against scratch marks.

In accordance with various embodiments, the PMUT device 100 can include metal layers (e.g., aluminum (Al)/titanium (Ti), molybdenum (Mo), etc.) patterned to form electrode 106 in particular shapes (e.g., ring, circle, square, octagon, hexagon, etc.) that are defined in-plane with the membrane 120. Electrodes can be placed at a maximum strain area of the membrane 120 or placed at close to either or both the surrounding edge support 102 and interior support 104. Furthermore, in one example, electrode 108 can be formed as a continuous layer providing a ground plane in contact with mechanical support layer 112, which can be formed from silicon or other suitable mechanical stiffening material. In still other embodiments, the electrode 106 can be routed along the interior support 104, advantageously reducing parasitic capacitance as compared to routing along the edge support 102.

For example, when actuation voltage is applied to the electrodes, the membrane 120 will deform and move out of plane. The motion then pushes the acoustic coupling layer 114 it is in contact with and an acoustic (ultrasonic) wave is generated. Oftentimes, vacuum is present inside the cavity 130 and therefore damping contributed from the media within the cavity 130 can be ignored. However, the acoustic coupling layer 114 on the other side of the membrane 120 can substantially change the damping of the PMUT device 100. For example, a quality factor greater than 20 can be observed when the PMUT device 100 is operating in air with atmosphere pressure (e.g., acoustic coupling layer 114 is air) and can decrease lower than 2 if the PMUT device 100 is operating in water (e.g., acoustic coupling layer 114 is water).

Figure 3:
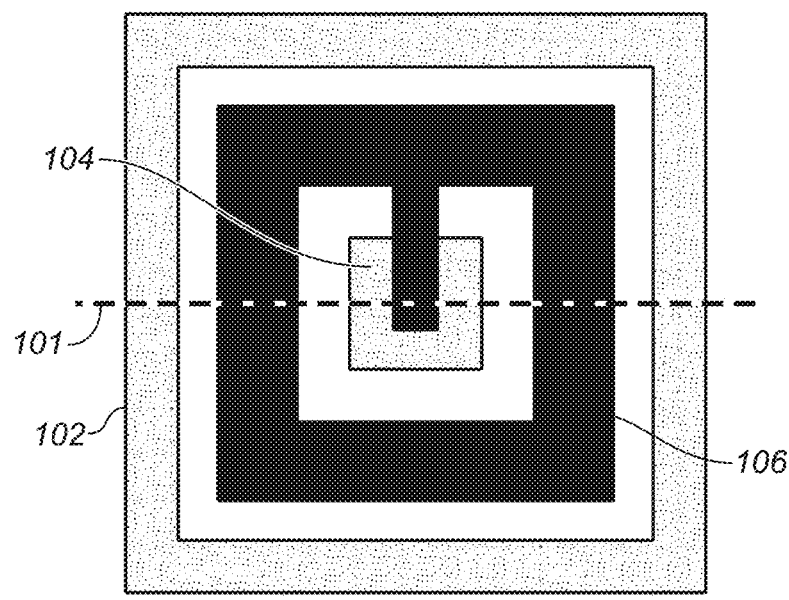
FIG. 3 is a top view of the PMUT device of FIG. 1, according to some embodiments.

FIG. 3 is a top view of the PMUT device 100 of FIG. 1A having a substantially square shape, which corresponds in part to a cross section along dotted line 101 in FIG. 3. Layout of surrounding edge support 102, interior support 104, and lower electrode 106 are illustrated, with other continuous layers not shown. It should be appreciated that the term "substantially" in "substantially square shape" is intended to convey that a PMUT device 100 is generally square-shaped, with allowances for variations due to manufacturing processes and tolerances, and that slight deviation from a square shape (e.g., rounded corners, slightly wavering lines, deviations from perfectly orthogonal corners or intersections, etc.) may be present in a manufactured device. While a generally square arrangement PMUT device is shown, alternative embodiments including rectangular, hexagon, octagonal, circular, or elliptical are contemplated. In other embodiments, more complex electrode or PMUT device shapes can be used, including irregular and non-symmetric layouts such as chevrons or pentagons for edge support and electrodes.

Figure 4:
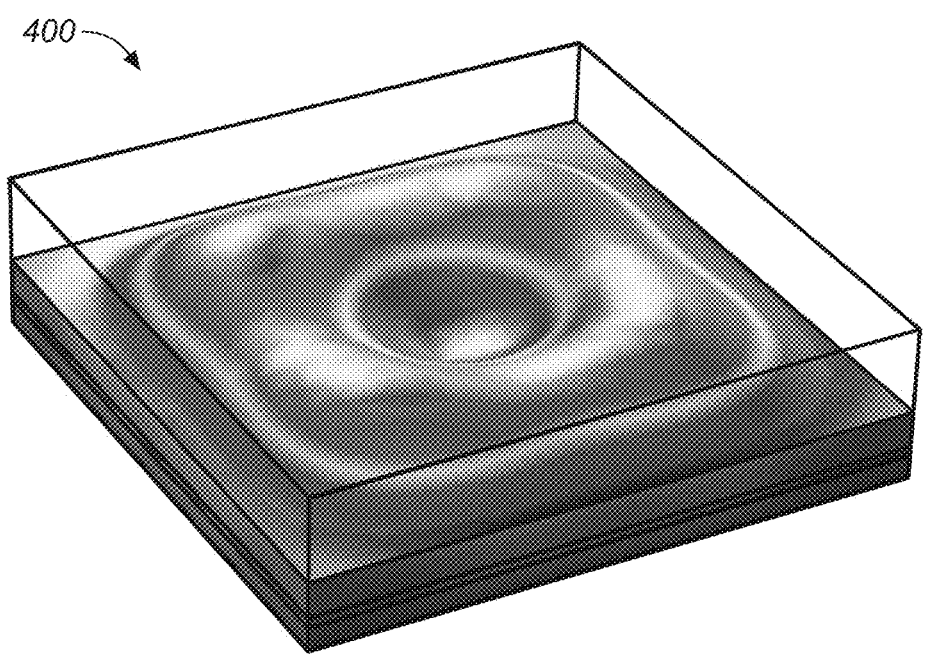
FIG. 4 is a simulated map illustrating maximum vertical displacement of the membrane of the PMUT device shown in FIGS. 1-3, according to some embodiments.

FIG. 4 is a simulated topographic map 400 illustrating maximum vertical displacement of the membrane 120 of the PMUT device 100 shown in FIGS. 1A-3. As indicated, maximum displacement generally occurs along a center axis of the lower electrode, with corner regions having the greatest displacement. As with the other figures, FIG. 4 is not drawn to scale with the vertical displacement exaggerated for illustrative purposes, and the maximum vertical displacement is a fraction of the horizontal surface area comprising the PMUT device 100. In an example PMUT device 100, maximum vertical displacement may be measured in nanometers, while surface area of an individual PMUT device 100 may be measured in square microns.

Figure 5:
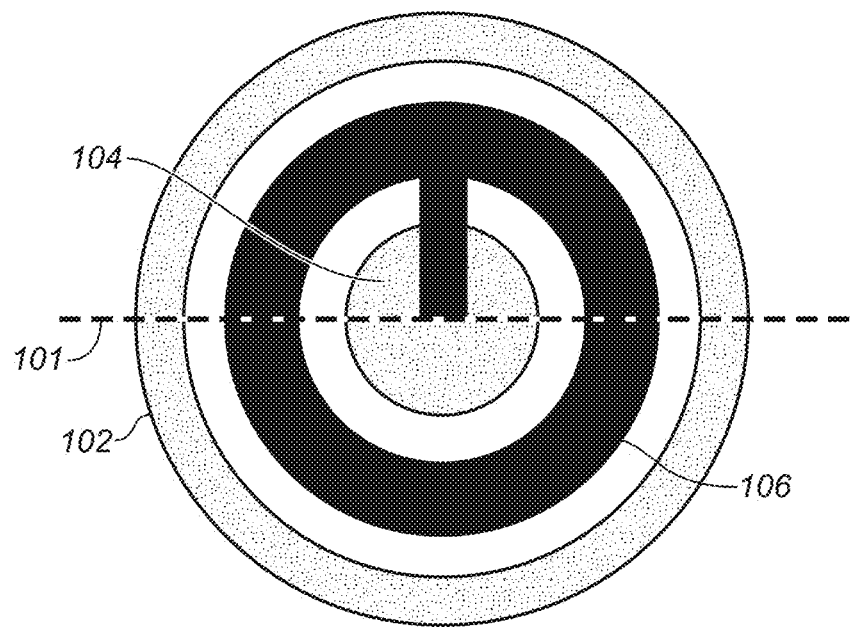
FIG. 5 is a top view of an example PMUT device having a circular shape, according to some embodiments.

FIG. 5 is a top view of another example of the PMUT device 100 of FIG. 1A having a substantially circular shape, which corresponds in part to a cross section along dotted line 101 in FIG. 5. Layout of surrounding edge support 102, interior support 104, and lower electrode 106 are illustrated, with other continuous layers not shown. It should be appreciated that the term "substantially" in "substantially circular shape" is intended to convey that a PMUT device 100 is generally circle-shaped, with allowances for variations due to manufacturing processes and tolerances, and that slight deviation from a circle shape (e.g., slight deviations on radial distance from center, etc.) may be present in a manufactured device.

Figure 6:
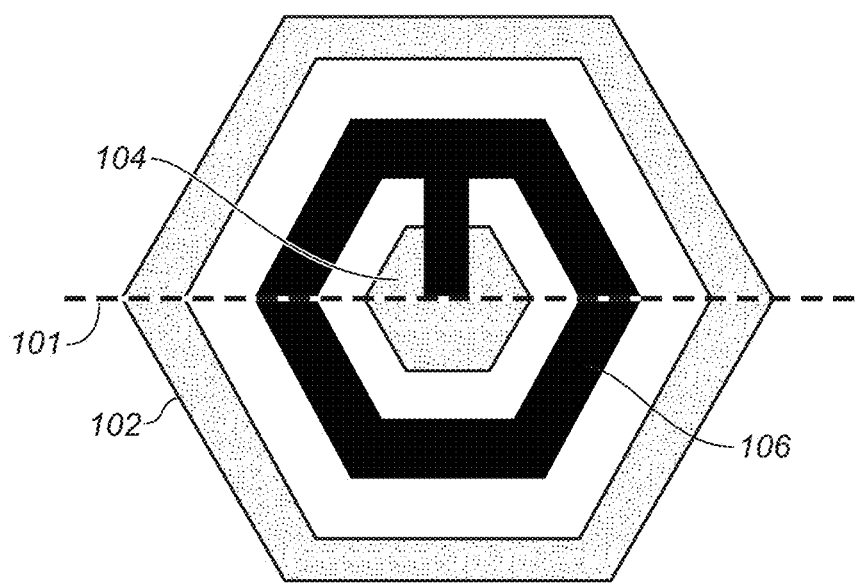
FIG. 6 is a top view of an example PMUT device having a hexagonal shape, according to some embodiments.

FIG. 6 is a top view of another example of the PMUT device 100 of FIG. 1A having a substantially hexagonal shape, which corresponds in part to a cross section along dotted line 101 in FIG. 6. Layout of surrounding edge support 102, interior support 104, and lower electrode 106 are illustrated, with other continuous layers not shown. It should be appreciated that the term "substantially" in "substantially hexagonal shape" is intended to convey that a PMUT device 100 is generally hexagon-shaped, with allowances for variations due to manufacturing processes and tolerances, and that slight deviation from a hexagon shape (e.g., rounded corners, slightly wavering lines, deviations from perfectly orthogonal corners or intersections, etc.) may be present in a manufactured device.

Figure 7:
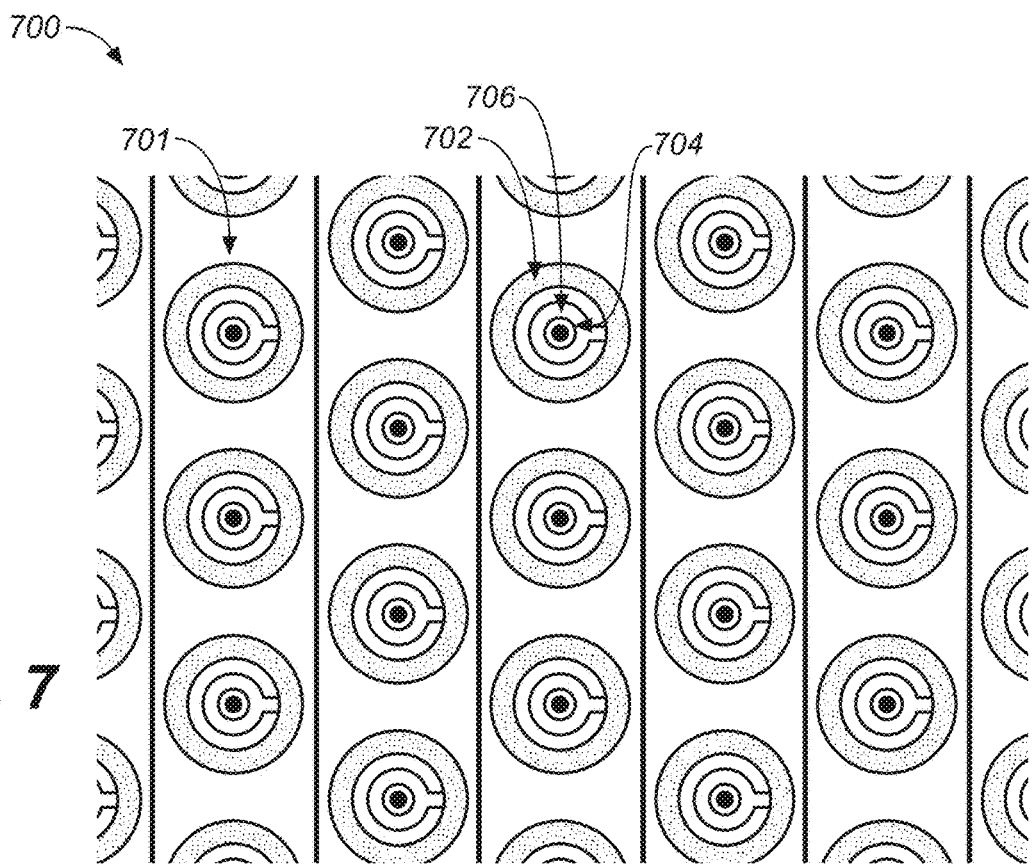
FIG. 7 illustrates an example array of circular-shaped PMUT devices, according to some embodiments.

FIG. 7 illustrates an example two-dimensional array 700 of circular-shaped PMUT devices 701 formed from PMUT devices having a substantially circular shape similar to that discussed in conjunction with FIGS. 1A, 2 and 5. Layout of circular surrounding edge support 702, interior support 704, and annular or ring shaped lower electrode 706 surrounding the interior support 704 are illustrated, while other continuous layers are not shown for clarity. As illustrated, array 700 includes columns of circular-shaped PMUT devices 701 that are offset. It should be appreciated that the circular-shaped PMUT devices 701 may be closer together, such that edges of the columns of circular-shaped PMUT devices 701 overlap. Moreover, it should be appreciated that circular-shaped PMUT devices 701 may contact each other. In various embodiments, adjacent circular-shaped PMUT devices 701 are electrically isolated. In other embodiments, groups of adjacent circular-shaped PMUT devices 701 are electrically connected, where the groups of adjacent circular-shaped PMUT devices 701 are electrically isolated.

Figure 8:
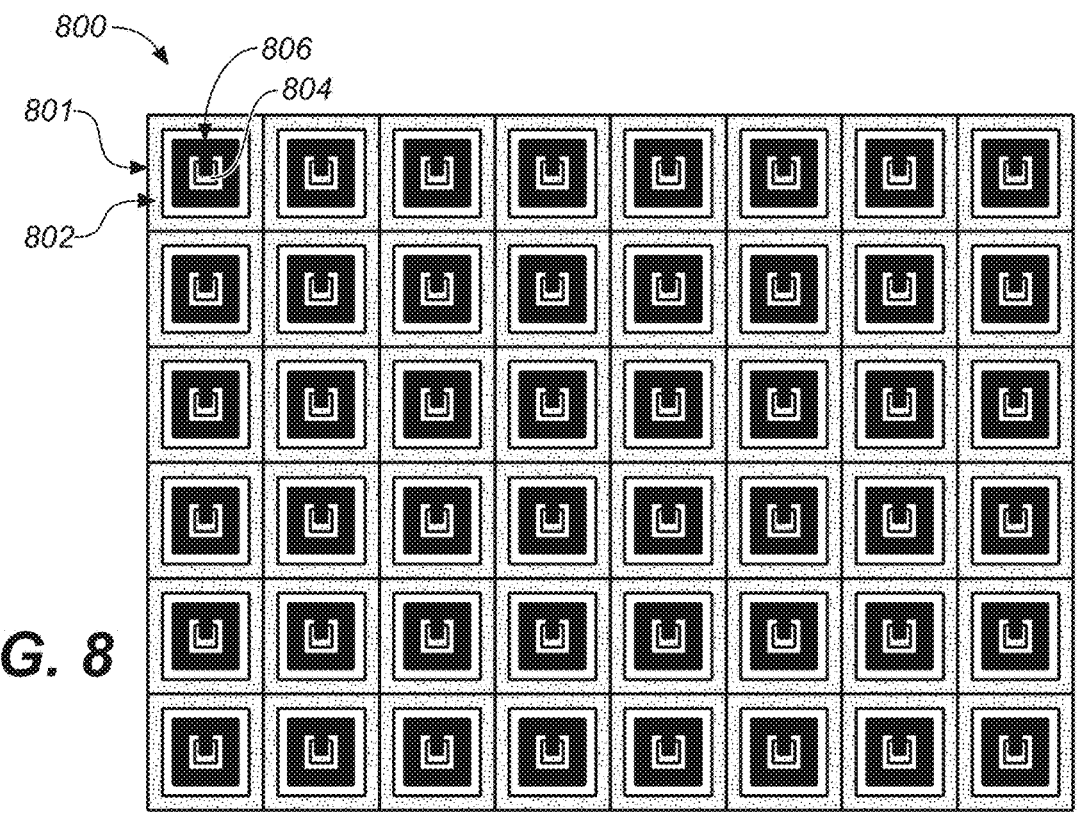
FIG. 8 illustrates an example array of square-shaped PMUT devices, according to some embodiments.

FIG. 8 illustrates an example two-dimensional array 800 of square-shaped PMUT devices 801 formed from PMUT devices having a substantially square shape similar to that discussed in conjunction with FIGS. 1A, 2 and 3. Layout of square surrounding edge support 802, interior support 804, and square-shaped lower electrode 806 surrounding the interior support 804 are illustrated, while other continuous layers are not shown for clarity. As illustrated, array 800 includes columns of square-shaped PMUT devices 801 that are in rows and columns. It should be appreciated that rows or columns of the square-shaped PMUT devices 801 may be offset. Moreover, it should be appreciated that square-shaped PMUT devices 801 may contact each other or be spaced apart. In various embodiments, adjacent square-shaped PMUT devices 801 are electrically isolated. In other embodiments, groups of adjacent square-shaped PMUT devices 801 are electrically connected, where the groups of adjacent square-shaped PMUT devices 801 are electrically isolated.

Figure 9:
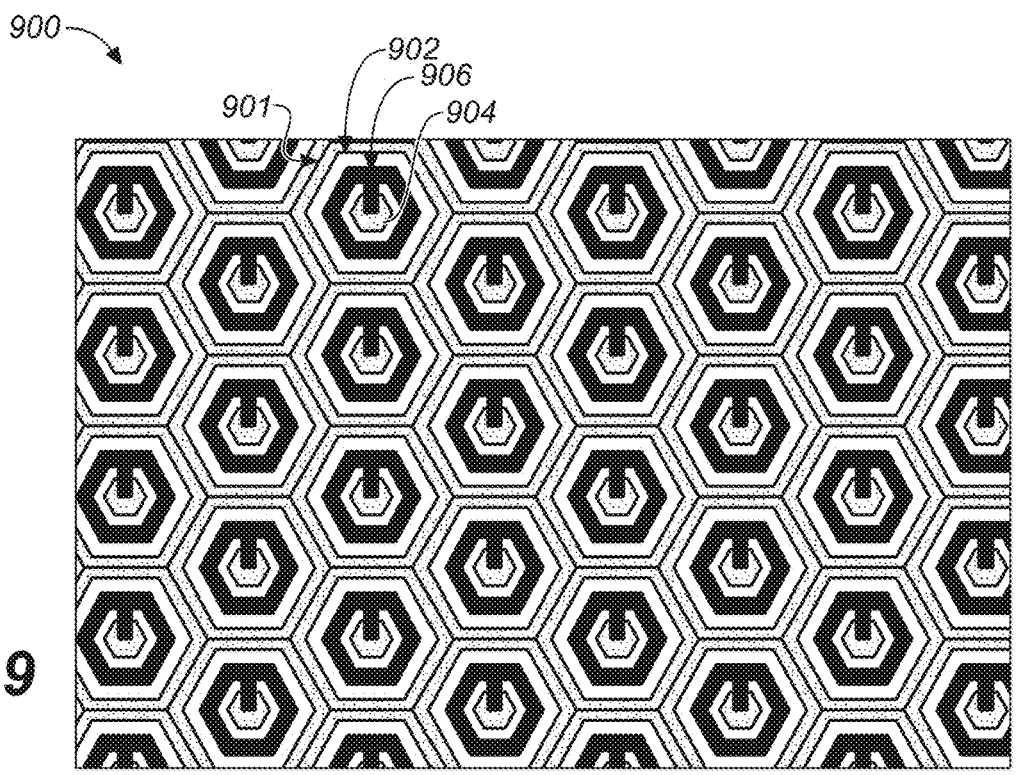
FIG. 9 illustrates an example array of hexagonal-shaped PMUT devices, according to some embodiments.

FIG. 9 illustrates an example two-dimensional array 900 of hexagon-shaped PMUT devices 901 formed from PMUT devices having a substantially hexagon shape similar to that discussed in conjunction with FIGS. 1A, 2 and 6. Layout of hexagon-shaped surrounding edge support 902, interior support 904, and hexagon-shaped lower electrode 906 surrounding the interior support 904 are illustrated, while other continuous layers are not shown for clarity. It should be appreciated that rows or columns of the hexagon-shaped PMUT devices 901 may be offset. Moreover, it should be appreciated that hexagon-shaped PMUT devices 901 may contact each other or be spaced apart. In various embodiments, adjacent hexagon-shaped PMUT devices 901 are electrically isolated. In other embodiments, groups of adjacent hexagon-shaped PMUT devices 901 are electrically connected, where the groups of adjacent hexagon-shaped PMUT devices 901 are electrically isolated. While FIGS. 7, 8 and 9 illustrate example layouts of PMUT devices having different shapes, it should be appreciated that many different layouts are available. Moreover, in accordance with various embodiments, arrays of PMUT devices are included within a MEMS layer.

In operation, during transmission, selected sets of PMUT devices in the two-dimensional array can transmit an acoustic signal (e.g., a short ultrasonic pulse) and during sensing, the set of active PMUT devices in the two-dimensional array can detect an interference of the acoustic signal with an object (in the path of the acoustic wave). The received interference signal (e.g., generated based on reflections, echoes, etc. Of the acoustic signal from the object) can then be analyzed. As an example, an image of the object, a distance of the object from the sensing component, a density of the object, a motion of the object, etc., can all be determined based on comparing a frequency and/or phase of the interference signal with a frequency and/or phase of the acoustic signal. Moreover, results generated can be further analyzed or presented to a user via a display device (not shown).

FIG. 10 illustrates a pair of example PMUT devices 1000 in a PMUT array, with each PMUT sharing at least one common edge support 1002. As illustrated, the PMUT devices have two sets of independent lower electrode labeled as 1006 and 1026. These differing electrode patterns enable antiphase operation of the PMUT devices 1000, and increase flexibility of device operation. In one embodiment, the pair of PMUTs may be identical, but the two electrodes could drive different parts of the same PMUT antiphase (one contracting, and one extending), such that the PMUT displacement becomes larger. While other continuous layers are not shown for clarity, each PMUT also includes an upper electrode (e.g., upper electrode 108 of FIG. 1A). Accordingly, in various embodiments, a PMUT device may include at least three electrodes.

FIGS. 11A, 11B, 11C, and 11D illustrate alternative examples of interior support structures, in accordance with various embodiments. Interior supports structures may also be referred to as "pinning structures," as they operate to pin the membrane to the substrate. It should be appreciated that interior support structures may be positioned anywhere within a cavity of a PMUT device, and may have any type of shape (or variety of shapes), and that there may be more than one interior support structure within a PMUT device. While FIGS. 11A, 11B, 11C, and 11D illustrate alternative examples of interior support structures, it should be appreciated that these examples or for illustrative purposes, and are not intended to limit the number, position, or type of interior support structures of PMUT devices.

Figure 11A:
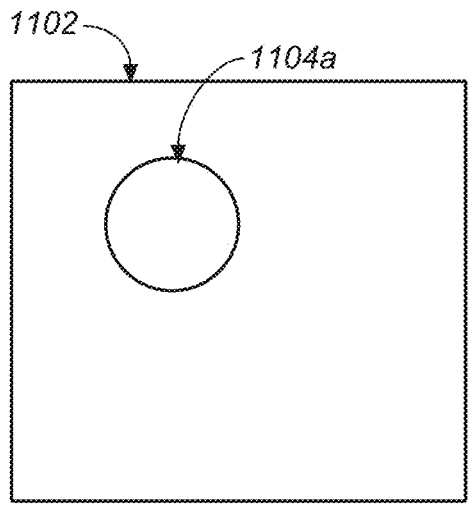
FIGS. 11A, 11B, 11C, and 11D illustrate alternative examples of interior support structures, according to various embodiments.
Figure 11B:
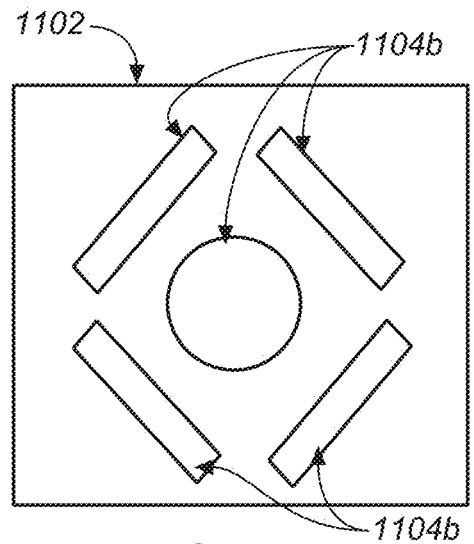
Figure 11C:
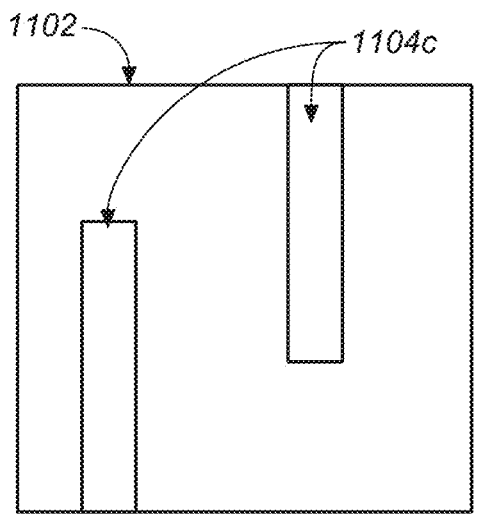
Figure 11D:
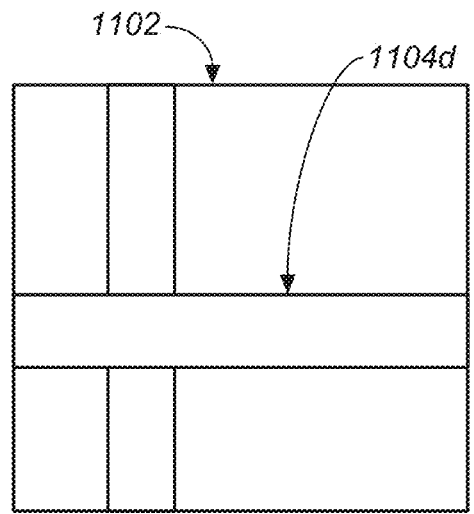

For example, interior supports structures do not have to be centrally located with a PMUT device area, but can be non-centrally positioned within the cavity. As illustrated in FIG. 11A, interior support 1104a is positioned in a non-central, off-axis position with respect to edge support 1102. In other embodiments such as seen in FIG. 11B, multiple interior supports 1104b can be used. In this embodiment, one interior support is centrally located with respect to edge support 1102, while the multiple, differently shaped and sized interior supports surround the centrally located support. In still other embodiments, such as seen with respect to FIGS. 11C and 11D, the interior supports (respectively 1104c and 1104d) can contact a common edge support 1102. In the embodiment illustrated in FIG. 11D, the interior supports 1104d can effectively divide the PMUT device into subpixels. This would allow, for example, activation of smaller areas to generate high frequency ultrasonic waves, and sensing a returning ultrasonic echo with larger areas of the PMUT device. It will be appreciated that the individual pinning structures can be combined into arrays.

Figure 12:
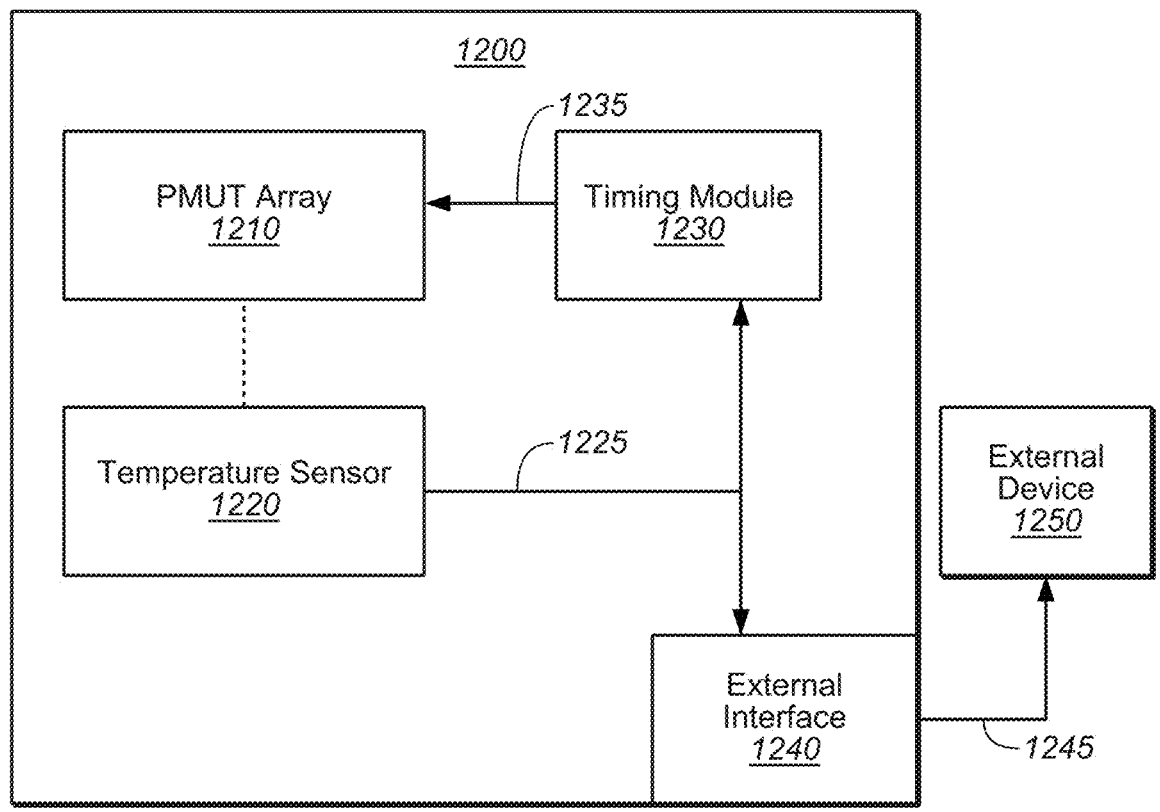
FIG. 12 is a block diagram of a PMUT array that includes temperature measurement.

FIG. 12 is a block diagram of a PMUT device 1200 that includes temperature measurement. PMUT array 1210 is a two-dimensional array of PMUT devices similar to array 700, including variations that may be introduced in such an array. Temperature sensor 1220 includes circuitry for temperature measurement. Timing module 1230 receives temperature sensor information 1225 from temperature sensor 1220 and creates timing signals 1235. Among other things, timing module 1230 may adjust for changes in expected ultrasonic signal travel time based on the measured temperature. Timing signals 1235 are used to drive PMUT array 1210.

There are a number of ways known in the art to provide temperature sensor 1220. In an embodiment, temperature sensor 1220 is an integrated silicon thermistor that can be incorporated in the MEMS manufacturing process with PMUT array 1210. In another embodiment, temperature sensor 1220 is a MEMS structure different from PMUT array 1210 but compatible with the MEMS manufacturing process for PMUT array 1210. In another embodiment, temperature sensor 1220 is circuitry that determines temperature by associating a known temperature dependency with the quality factor (Q) of some or all of the resonators that comprise the PMUT array 1210. In another embodiment, temperature sensor 1220 and a portion of timing module 1230 together comprise a MEMS oscillator manufactured with a process compatible with PMUT array 1210 from which a frequency stable clock may be directly derived over a broad operating temperature range.

By providing temperature sensor information 1225, the PMUT device can generate dependable frequencies for timing signals 1235. In this way, the PMUT device can be clockless, not requiring a separate input from an external clock. This simplifies the design process for an engineer incorporating the PMUT device 1200 into a design. An external oscillator or clock signal is not needed, eliminating a part and associated routing. In the case of a typical quartz oscillator used for an external clock-generation circuit, there may also be an efficiency gain as quartz devices typically consume more power than MEMS-based clocks. Having the timing signals 1235 generated on chip further enables improved signal compensation and conditioning.

The temperature or reference clock may optionally be shared outside of device 1200. Optional interface 1240 in communication with temperature sensor 1220 or timing module 1230 provides signals 1245 to an external device 1250. Signals 1245 may represent measured temperature or a reference clock frequency from the PMUT device 1200. Optional external device 1250 may include another integrated circuit device, or a data or system bus. Other blocks and signals may be introduced into PMUT device 1200, provided that an external clock signal is not used to generate timing signals 1235.

Surface Acoustic Wave (SAW) devices are commonly used as resonators and filters. In a SAW device, an acoustic wave is launched along the surface of a piezoelectric material. A surface acoustic wave is typically launched using a set of interdigitated electrodes, although other electrode configurations may also be employed.

This is different than BAW (Bulk Acoustic Wave) or BAR (Bulk Acoustic Resonator) devices where a wave is launched inside the bulk of the piezo material. It is also different from PMUT devices, where a flexural motion is induced in the piezo membrane.

FIGS. 13A-C illustrate an embodiment of a device operating in a SAW mode. FIG. 13A shows in operation a MEMS device 1300 similar to PMUT device 100'. In PMUT mode, reflected energy is measured from signals orthogonal to a reflected surface, such as an echo in an acoustic frequency range. By contrast, in SAW mode, energy propagated through and along the surface of a piezoelectric material is measured in MEMS device 1300. Such a signal may be an ambient wave in a radio frequency range. FIG. 13B illustrates a cross section of MEMS device 1300 showing displacement in a SAW mode. FIG. 13C illustrates another frequency and its resulting displacement in SAW mode. Similar to FIG. 4, the illustrations in FIGS. 13B and 13C are exaggerated in scale to show resulting movement of membrane 1320. It should be appreciated that the embodiments described in FIGS. 13A-C may also include a PMUT device having an interior support (e.g., PMUT device 100).

Like a PMUT device, a SAW device relies upon the conversion of mechanical energy causing a deformation in membrane 1320 and its piezoelectric layer 1310 into an electrical signal characteristic of the energy input. Similar manufacturing techniques may be used to fabricate a MEMS PMUT device and a MEMS SAW device. The piezoelectric material in either instance may be tuned by design for sensitivity to particular frequencies and for particular applications. For SAW mode, applications are likely to include a number of tasks, including fingerprint recognition through ultrasonic frequencies. SAW devices are used with radio frequencies as filters. It is also known in the art to adapt a SAW device to detect temperature, pressure, the existence of chemicals or other desired parameters.

In some embodiments, MEMS devices 1300 in an array may be identical for operation in PMUT mode and SAW mode. Further, selective switching between one mode and the other may be provided. In other embodiments, the array may include heterogeneous array elements that are compatible with the same manufacturing process. Some elements may be designed and tuned for performance in PMUT mode, while other elements may be designed and tuned for performance in SAW mode. The array elements may also include variation within each mode. As an example, there may be elements designed and tuned for performance in SAW mode that target different radio frequencies of interest for filtering. As understood in the art, there are multiple ways to design and tune the elements for particular performance, including size of array element, composition and thickness of material stack, elasticity of the piezoelectric layer, and size and structure of the supports.

Figure 14A:
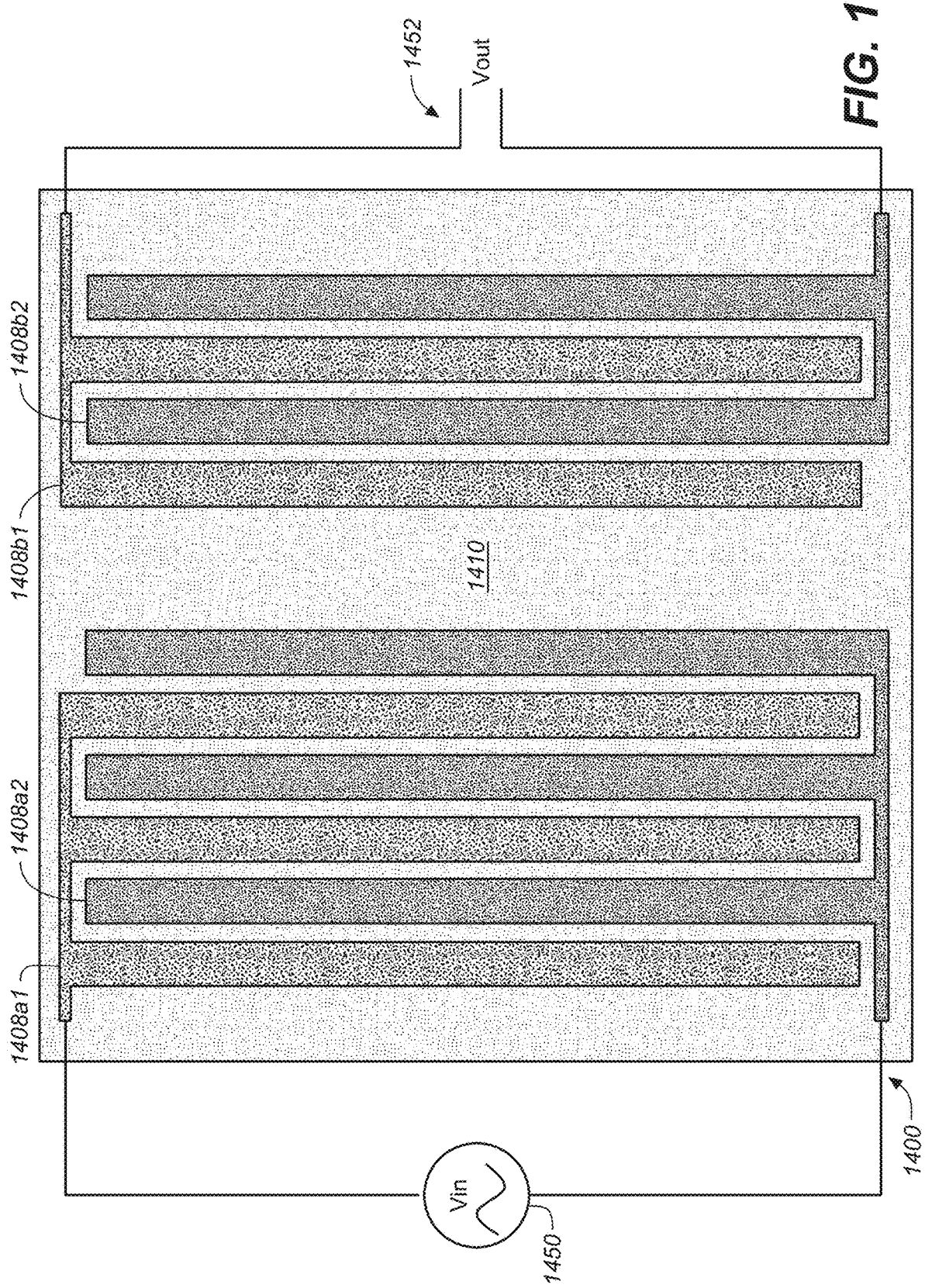

FIGS. 14A-14B depict an embodiment of a dual-mode device 1400 that can be selectively operated both in SAW and PMUT modes, by switching between the two modes. FIG. 14A is a top plan view, while FIG. 14B is a side cross-sectional view. The dual-mode device 1400 includes a piezoelectric layer 1410 positioned over a substrate 1440 to define a cavity 1430. In one embodiment, piezoelectric layer 1410 is attached to a surrounding edge support 1402. Edge support 1402 and substrate 1440 may be unitary (as shown) or separate components, in either case made of dielectric materials, such as silicon dioxide, silicon nitride or aluminum oxide that have electrical connections in the sides or in vias through edge support 1402. It should be appreciated that dual-mode device 1400 may also include an interior support (e.g., interior support 104 of PMUT device 100).

The dual-mode device 1400 further includes a lower electrode 1406, disposed on a bottom surface of the piezoelectric layer 1410; the lower electrode 1406 may be considered to be equivalent to the lower electrode 106 depicted in FIGS. 1A-1B. The dual-mode device 1400 also includes a first pair of interdigitated electrodes 1408a and a second pair of interdigitated electrodes 1408b, both disposed on a top surface of the piezoelectric layer 1410. The two pairs of interdigitated electrodes 1408a, 1408b may be considered to be equivalent to the upper electrode 108 depicted in FIGS. 1A-1B. The first pair of interdigitated electrodes 1408a comprises electrodes 1408a1 and 1408a2, disposed in an interdigitated pattern. The second pair of interdigitated electrodes 1408b comprises electrodes 1408b1 and 1408b2, disposed in an interdigitated pattern. The two pairs of interdigitated electrodes 1408a and 1408b are separated by a distance d.

In the SAW mode, electrodes 1408a1 and 1408a2 are used to inject an AC signal from an AC source 1450 and generate a surface acoustic wave in the surface of the piezoelectric layer 1410 across the distance d, while electrodes 1408b1 and 1408b2 are used to receive the propagated wave and convert the acoustic wave to a voltage output 1452. In this SAW mode, the dual-mode device 1400 can be used as a sensor, filter or resonator, for example. In this configuration, lower electrode 1406 can be either ground or floating.

In the PMUT mode, electrodes 1408a1, 1408a2, 1408b1, and 1408b2 are all driven at the same potential, with electrode 1406 at another potential. In the PMUT mode, the dual-mode device 1400 produces a flexural mode of motion in the piezoelectric layer 1410. In the PMUT mode, the dual-mode device 1400 can be used as a sensor, such as a fingerprint sensor or temperature sensor, for example.

Figure 15:
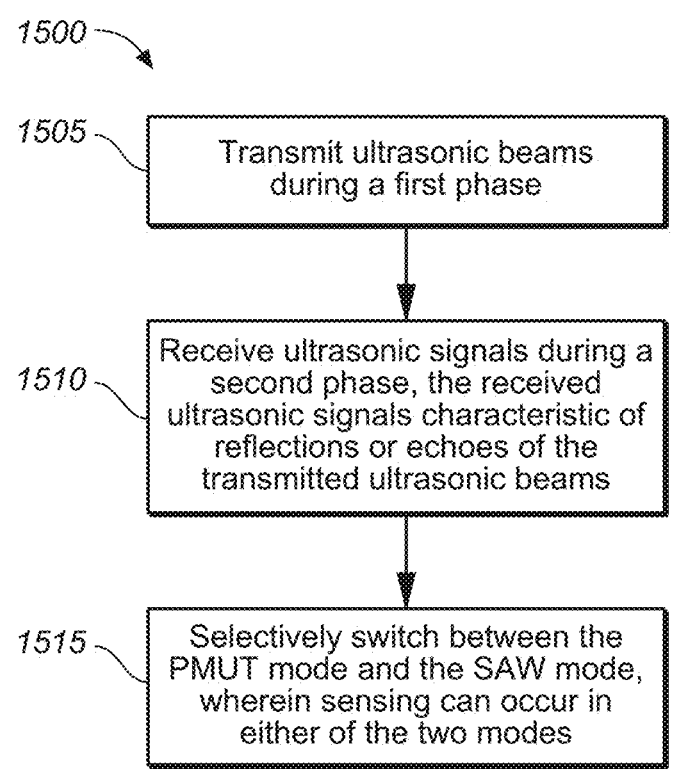
FIG. 15 is a flow chart, illustrating an embodiment of a method for operating an array of PMUT/SAW dual-mode devices in an active operational mode.

An embodiment of a method for operating an array of PMUT/SAW dual-mode devices 1400 in an active operational mode is shown in FIG. 15. In the method 1500, ultrasonic beams are transmitted 1505 during a first phase. The ultrasonic signals are received 1510 during a second phase, where the received ultrasonic signals are characteristic of reflections or echoes of the transmitted ultrasonic beams. Devices in the array are selectively switched 1515 between the PMUT mode and the SAW mode, wherein sensing can occur in either of the two modes.

In another embodiment, the PMUT device includes a Capacitive Micromachined Ultrasonic Transducer (CMUT) portion or is operated in part in a CMUT mode. Like a PMUT device, a CMUT device relies upon the deflection of a membrane through an electrical effect—whether electromechanical in the case of the PMUT, or electrostatic in the case of the CMUT. Similar manufacturing techniques may be used to fabricate a MEMS PMUT device and a MEMS CMUT device. In operation, a PMUT device uses electrodes proximate a piezoelectric layer in the membrane to generate or to measure a deformation of the membrane. By contrast, at least one electrode in a CMUT device is positioned on the other side of a cavity to create a capacitive effect. The design and tuning of the layers in the material stack may target particular applications and use in a PMUT mode or a CMUT mode. In CMUT mode, a device may be used for fingerprint recognition as well as other applications.

Figure 16A:
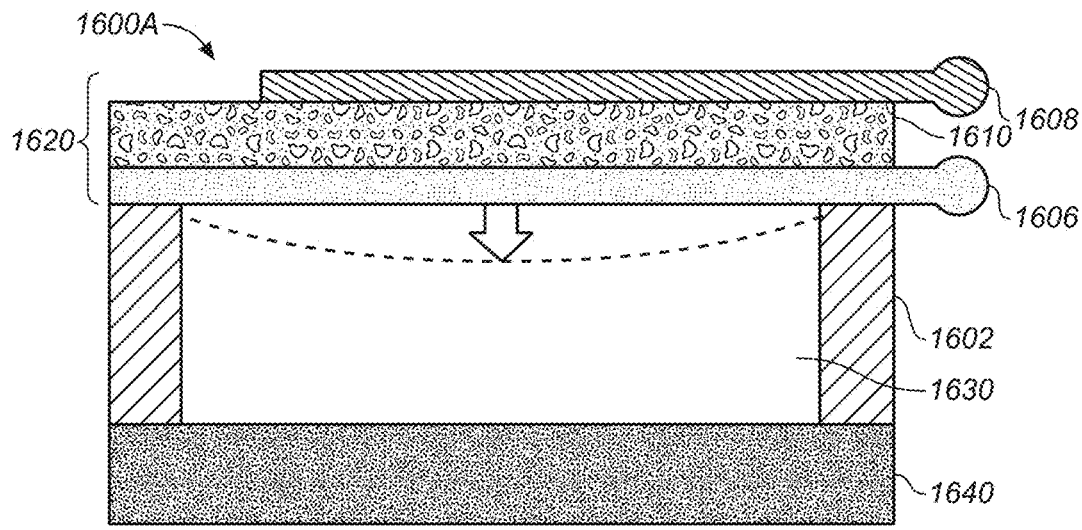
FIG. 16A illustrates an embodiment of a device operable in a PMUT mode.

FIG. 16A illustrates an embodiment of a MEMS device operating in a PMUT mode. The essential elements of PMUT device 100' are captured in device 1600A to show operation in a PMUT mode. Membrane 1620 is deformed out of plane based on the piezoelectric effect. Membrane 1620 includes top electrode 1608, bottom electrode 1606, and piezoelectric layer 1610. The membrane 1620 is attached to a substrate 1640 through supports 1602 along the periphery of the device, forming cavity 1630. For operation in PMUT mode, the piezoelectric layer 1610 is proximate the top electrode 1608 and the bottom electrode 1606. An AC voltage is either transmitted across electrodes 1606 and 1608 to force a deformation, or such a signal is read across electrodes 1606 and 1608 to measure a deformation. The signal may be an ultrasonic signal. A DC bias voltage is not typically required for operation of device 1600A in PMUT mode. It should be appreciated that device 1600A may also include an interior support (e.g., interior support 104 of PMUT device 100).

Figure 16B:
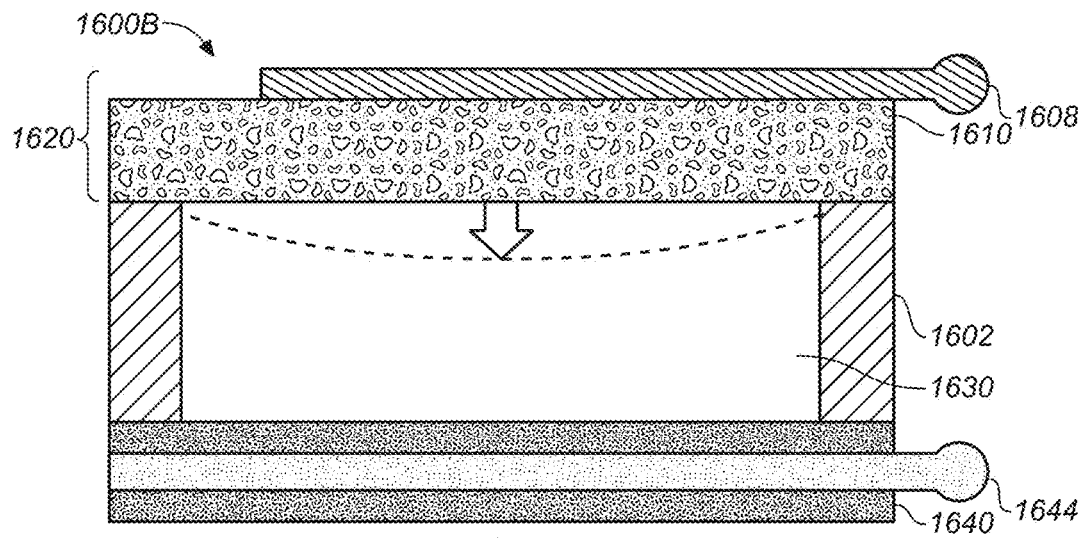
FIG. 16B illustrates an embodiment of a device operable in a Capacitive Micromachined Ultrasonic Transducer (CMUT) mode.

FIG. 16B illustrates an embodiment of a device operable in a CMUT mode. Device 1600B is similar to device 1600A, but includes electrode 1644 and removes bottom electrode 1606. Device 1600B is a simplified device to illustrate operation in CMUT mode. Device 1600B forms a capacitor between membrane 1620 and substrate 1640. It should be appreciated that device 1600B may also include an interior support (e.g., interior support 104 of PMUT device 100). Top electrode 1608 and electrode 1644 are the electrode layers of the capacitor, while the combination of membrane dielectric 1620, cavity 1630, and dielectric on substrate 1640 form the dielectric layer of the capacitor. In operation, a DC bias voltage is typically applied between the electrodes 1608 and 1644, and membrane 1620 is deflected towards substrate 1640 by electrostatic forces. The mechanical restoring forces caused by stiffness of membrane 1620 resist the electrostatic force. Signals can then be transmitted on, or received from, oscillations in membrane 1620 as an AC voltage.

Figure 16C:
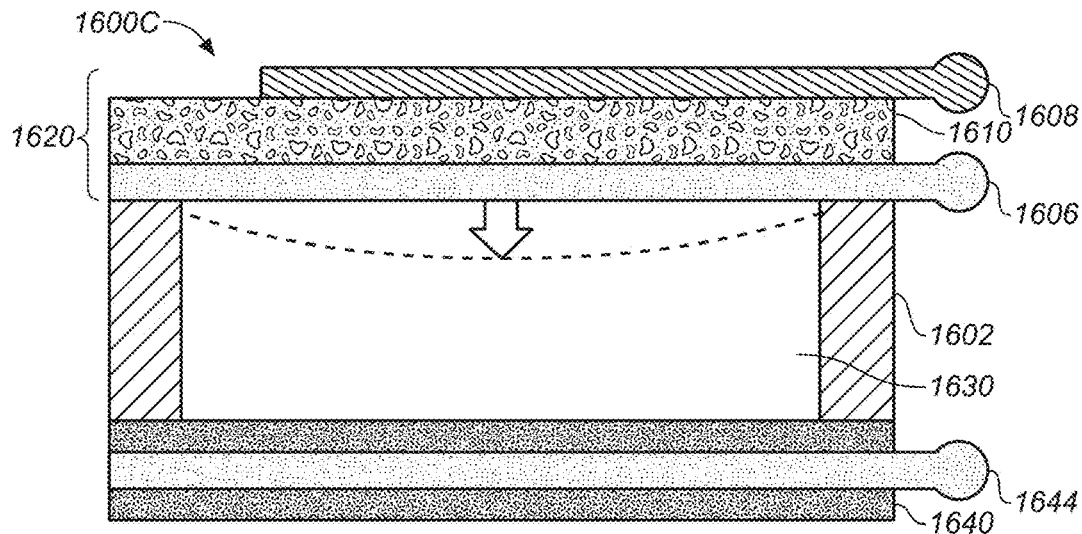
FIG. 16C illustrates an embodiment of a device operable in a PMUT mode or a CMUT mode.

FIG. 16C illustrates an embodiment of a device 1600C operable in a PMUT mode or a CMUT mode. Device 1600C is an integration of device 1600A and device 1600B. It is suitable for operation in either a PMUT mode or a CMUT mode. The PMUT mode arises with an AC voltage across electrodes 1606 and 1608. The CMUT mode arises with DC bias voltage and AC signal voltage across electrodes 1608 and 1644. There may be other layers, over layers, and intermediate layers to membrane 1620 and the devices illustrated in FIG. 16C, such as stiffening layers, coupling layers, etc. The piezoelectric layer 1610 in device 1600B may comprise a non-piezoelectric material in certain embodiments. The design and tuning of the layers in the material stack may target particular applications and use in a PMUT mode or a CMUT mode. In CMUT mode, a device may be used as a sensitive pressure sensor, such as for fingerprint recognition, either to transmit or to receive ultrasonic signals. Other sensor capabilities are possible. It should be appreciated that device 1500C may also include an interior support (e.g., interior support 104 of PMUT device 100).

Some embodiments may comprise elements similar to device 1600C, which may be operated in either a PMUT mode or a CMUT mode, including being switchable between the two modes. In other embodiments, an array may include heterogeneous PMUT and CMUT elements similar to devices 1600A and 1600B that are compatible with the same manufacturing process.

Some elements may be designed and tuned for performance in PMUT mode, while other elements may be designed and tuned for performance in CMUT mode. There may be embodiments for a fingerprint recognition application where it is preferable to transmit an ultrasonic signal in one mode and to detect its reflection or echo in a different mode. As understood in the art, there are multiple ways to design and tune the elements for particular performance, including size of array element, composition and thickness of material stack, elasticity of the diaphragm, and size and structure of the supports.

FIG. 17, which is a side cross-sectional view, depicts an embodiment of a dual-mode device 1700 that can be selectively operated both in CMUT and PMUT modes. The dual-mode device 1700 includes a piezoelectric layer 1710 positioned over a substrate 1740 to define a cavity 1730. In one embodiment, piezoelectric layer 1710 is attached to a surrounding edge support 1702. Edge support 1702 and substrate 1740 may be unitary (as shown) or separate components, in either case made of dielectric materials, such as silicon dioxide, silicon nitride or aluminum oxide that have electrical connections in the sides or in vias through edge support 1702. It should be appreciated that device 1600 may also include an interior support (e.g., interior support 104 of PMUT device 100).

The dual-mode device 1700 further includes a lower electrode 1706, disposed on a bottom surface of the piezoelectric layer 1710; the lower electrode 1706 may be considered to be equivalent to the lower electrode 106 depicted in FIGS. 1A-1B. The dual-mode device 1700 also includes an upper electrode 1708 disposed on a top surface of the piezoelectric layer 1710. The upper electrodes 1708 may be considered to be equivalent to the upper electrode 108 depicted in FIGS. 1A-1B. In addition to the lower electrode 1706 and upper electrode 1708, the dual-mode device also includes a third electrode 1744, disposed on an upper surface of the substrate 1740 and spaced apart from the first, or lower, electrode 1706. The dual-mode device 1700 is seen to be essentially the same as device 1600C in FIG. 16C.

In the CMUT mode, the piezoelectric layer 1710 is actuated electrostatically by placing a potential difference across the air gap under the piezoelectric layer 1710, between electrodes 1708 and 1744. In this mode, electrode 1706 may be either at the same potential as electrode 1708 or floating. In an alternate embodiment, the CMUT mode is actuated electrostatically by placing a potential difference between electrodes 1706 and 1744. In this mode, electrode 1708 may be either at the same potential as electrode 1706 or floating.

In the PMUT mode, the piezoelectric layer 1710 is actuated piezoelectrically by placing a potential difference across the piezoelectric layer 1710, between electrodes 1706 and 1708. In this mode, electrode 1744 may be either at the same potential as electrode 1706 or floating.

Figure 18:
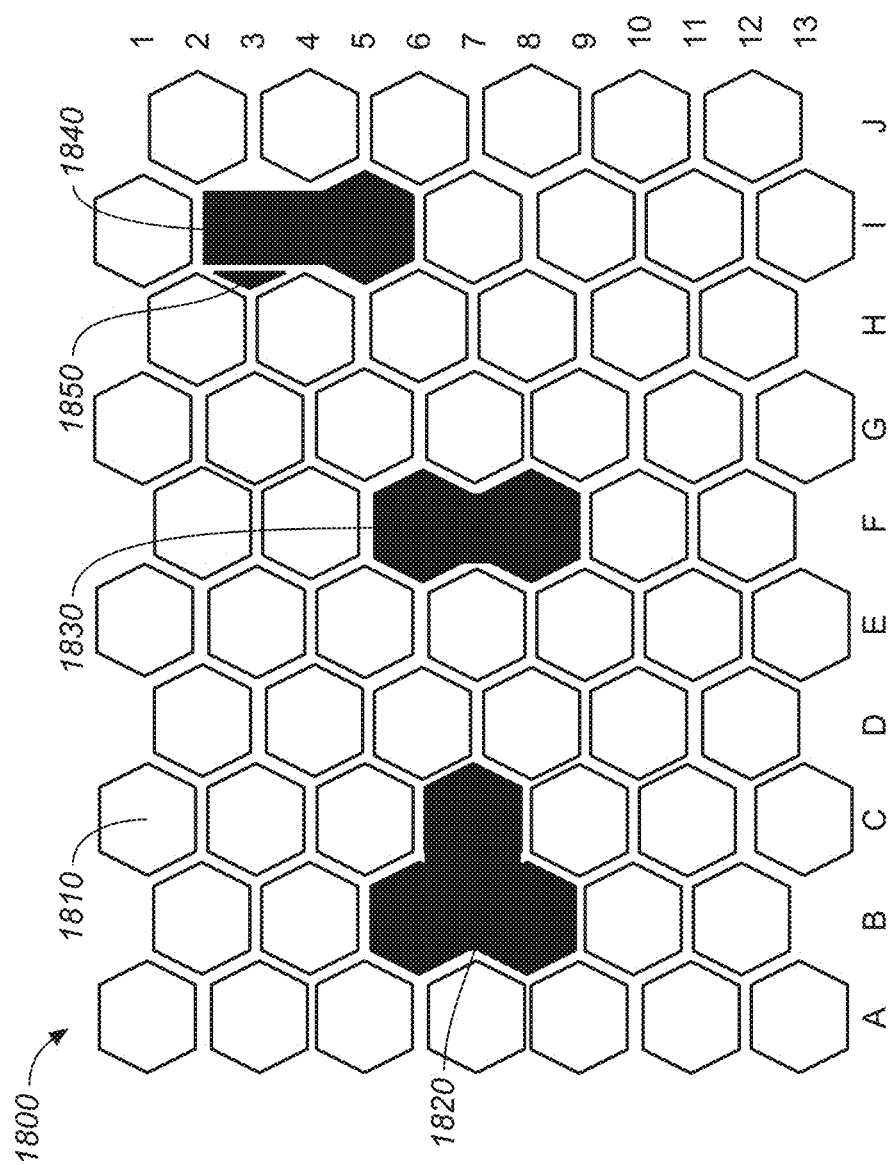
FIG. 18 illustrates several example array configurations.

FIG. 18 illustrates several example array configurations. The size of an array element is one of the design parameters to tune. In an embodiment, array 1800 is substantially comprised of PMUT devices, such as the element 1810 at row 1, column C. In this illustration, only the diaphragm shape is illustrated for clarity. Instead of a generally square PMUT device as shown in FIGS. 1A-1B or the circular PMUT device as shown in the array of FIG. 5, PMUT device 1810 is generally hexagonal. Other shapes and sizes could be used.

Embedded within array 1800 are alternative devices. Alternative devices 1820, 1830, 1840 and 1850 may be selected from differently configured PMUT devices, SAW devices, and CMUT devices, provided the material stack is compatible with the manufacture of PMUT device 1710. In this connection, various combinations of PMUT, SAW, and CMUT devices may be formed and operated.

The four shapes illustrated in alternative devices 1820, 1830, 1840 and 1850 permit tuning based on diaphragm size. It is also possible that the shape of alternative devices match PMUT device 1810. The shape of alternative devices may be pertinent to other effects, such as frequency selectivity for a SAW device. In control electronics (not shown), it would be possible to drive the alternative devices without disruption of the grid format. Device 1820 could be driven with control electronics for row 6, column B. Device 1850, which is a small triangle, could have its control electronics associated with row 3, column I, while device 1840 could have its control electronics associated with row 5, column I.

Figure 19:
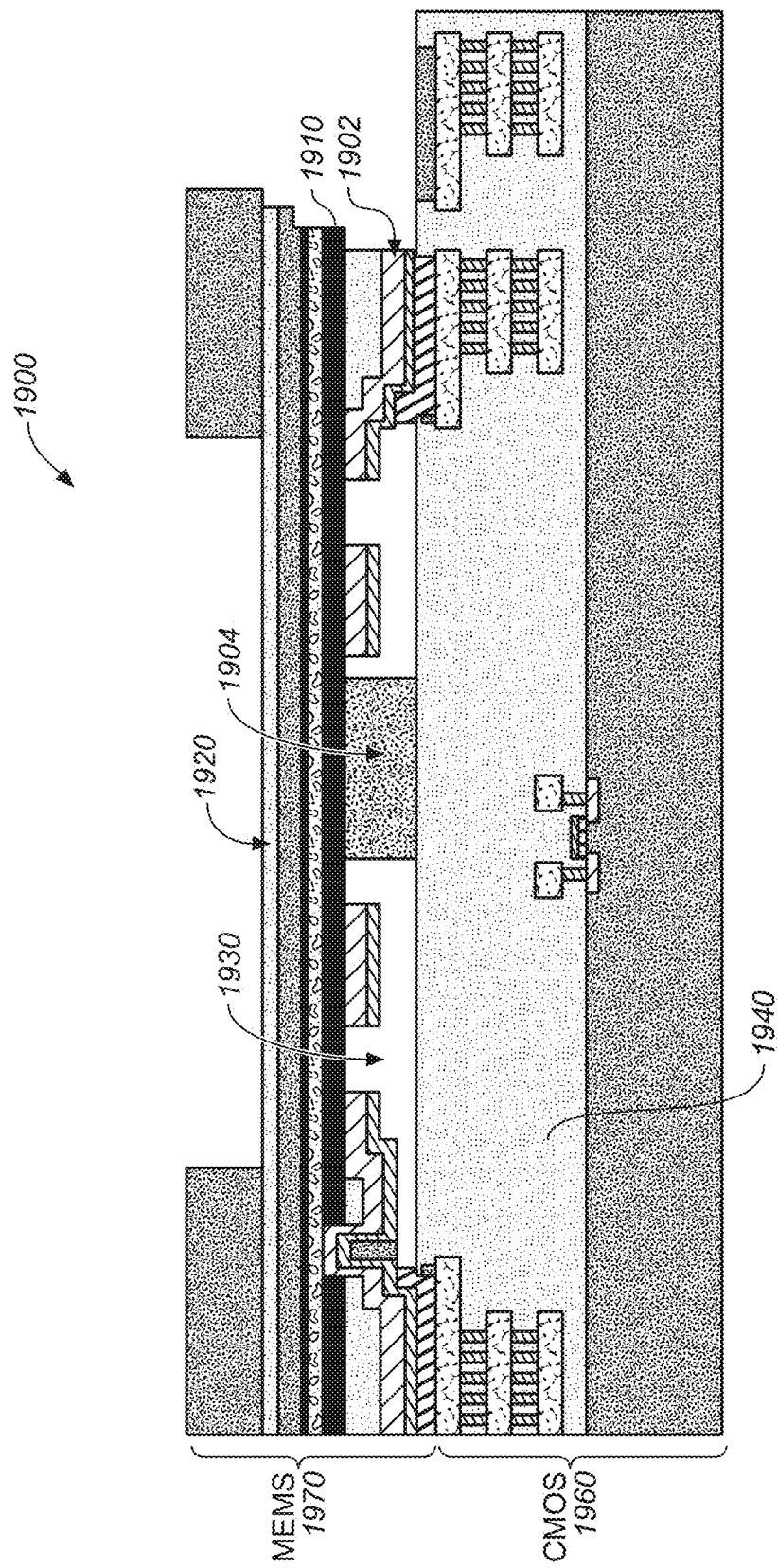
FIG. 19 illustrates in partial cross-section one embodiment of an integrated sensor of the present invention formed by wafer bonding.

FIG. 19 illustrates in partial cross section one embodiment of an integrated sensor 1800 formed by wafer bonding a substrate 1940 of a CMOS logic wafer 1960 and a MEMS wafer 1970 defining PMUT devices having a common edge support 1902. PMUT device 1900 has a membrane 1920 formed over a substrate 1940 to define cavity 1930. The membrane 1920, primarily composed of silicon etched along its periphery to form a relatively compliant section, is attached both to a surrounding edge support 1902. The membrane 1920 is formed from multiple layers, including a piezoelectric layer 1910. The sensor includes an interior pinning support 1904.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems and components have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Thus, the embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. A Piezoelectric Micromachined Ultrasonic Transducer (PMUT) device comprising:
    a substrate comprising a CMOS logic wafer;
    an edge support structure connected to the substrate;
    a membrane connected to the edge support structure such that a cavity is defined between the membrane and the substrate, the membrane configured to allow movement at ultrasonic frequencies, the membrane comprising:
        a piezoelectric layer, and
        first and second electrodes coupled to opposing sides of the piezoelectric layer;
    wherein the PMUT is also configured to operate in a Surface Acoustic Wave (SAW) mode.

2. The PMUT device of claim 1, further comprising an interior support structure disposed within the cavity and connected to the substrate and the membrane.

3. The PMUT device of claim 2, wherein the second electrode extends into the cavity and defines an area between the edge support structure and the interior support structure.

4. The PMUT device of claim 2, wherein at least one of the first electrode and the second electrode is electrically coupled through the interior support structure.

5. The PMUT device of claim 1, wherein the first electrode is a patterned layer.

6. The PMUT device of claim 1, the membrane further comprising:
    a mechanical support layer connected to the first electrode.

7. The PMUT device of claim 1, wherein the membrane further comprises a mechanical support layer.

8. The PMUT device of claim 1, wherein the piezoelectric layer defines a continuous layer.

9. The PMUT device of claim 1, wherein the piezoelectric layer is a patterned layer.

10. The PMUT device of claim 1, wherein the PMUT device is substantially circular such that the edge support structure and the membrane are substantially circular.

11. The PMUT device of claim 1, wherein the PMUT device is substantially square-shaped such that the edge support structure and the membrane are substantially square-shaped.

12. The PMUT device of claim 1, wherein the edge support structure is connected to an electric potential.

13. The PMUT device of claim 1, which is selectively switchable between the Surface Acoustic Wave (SAW) mode and an ultrasonic mode.

14. The PMUT device of claim 13, wherein the first electrode includes two pairs of interdigitated electrodes coupled to one side of the piezoelectric layer and wherein the second electrode is coupled to an opposing side of the piezoelectric layer;
    wherein in the SAW mode, a first pair of interdigitated electrodes is to inject an AC signal and generate a surface acoustic wave, which is to be received by a second pair of interdigitated electrodes, while the second electrode is either ground or floating; and
    wherein in the ultrasonic mode, the two pairs of interdigitated electrodes are all to be driven at the same potential, while the second electrode is to be driven at another potential, causing the device to produce a flexural mode of motion in the membrane.

15. A Piezoelectric Micromachined Ultrasonic Transducer (PMUT) device comprising:
a substrate;
an edge support structure connected to the substrate;
a membrane connected to the edge support structure such that a cavity is defined between the membrane and the substrate, the membrane configured to allow movement at ultrasonic frequencies, the membrane comprising:
a piezoelectric layer, and
first and second electrodes coupled to opposing sides of the piezoelectric layer;
wherein the PMUT is also configured to operate in a Surface Acoustic Wave (SAW) mode and is selectively switchable between the Surface Acoustic Wave (SAW) mode and an ultrasonic mode.

16. The PMUT device of claim 15, wherein the first electrode includes two pairs of interdigitated electrodes coupled to one side of the piezoelectric layer and wherein the second electrode is coupled to an opposing side of the piezoelectric layer;
wherein in the SAW mode, a first pair of interdigitated electrodes is to inject an AC signal and generate a surface acoustic wave, which is to be received by a second pair of interdigitated electrodes, while the second electrode is either ground or floating; and
wherein in the ultrasonic mode, the two pairs of interdigitated electrodes are all to be driven at the same potential, while the second electrode is to be driven at another potential, causing the device to produce a flexural mode of motion in the membrane.

17. The PMUT device of claim 16, further comprising an interior support structure disposed within the cavity and connected to the substrate and the membrane.

18. The PMUT device of claim 17, wherein the second electrode extends into the cavity and defines an area between the edge support structure and the interior support structure.

19. The PMUT device of claim 17, wherein at least one of the first electrode and the second electrode is electrically coupled through the interior support structure.

20. The PMUT device of claim 16, wherein the edge support structure is connected to an electric potential.

21. A Piezoelectric Micromachined Ultrasonic Transducer (PMUT) device comprising:
a substrate;
an edge support structure connected to the substrate, wherein the edge support structure is connected to an electric potential;
a membrane connected to the edge support structure such that a cavity is defined between the membrane and the substrate, the membrane configured to allow movement at ultrasonic frequencies, the membrane comprising:
a piezoelectric layer, and
first and second electrodes coupled to opposing sides of the piezoelectric layer;
wherein the PMUT is also configured to operate in a Surface Acoustic Wave (SAW) mode.

22. The PMUT device of claim 21, which is selectively switchable between the Surface Acoustic Wave (SAW) mode and an ultrasonic mode.

23. The PMUT device of claim 22, wherein the first electrode includes two pairs of interdigitated electrodes coupled to one side of the piezoelectric layer and wherein the second electrode is coupled to an opposing side of the piezoelectric layer;
wherein in the SAW mode, a first pair of interdigitated electrodes is to inject an AC signal and generate a surface acoustic wave, which is to be received by a second pair of interdigitated electrodes, while the second electrode is either ground or floating; and
wherein in the ultrasonic mode, the two pairs of interdigitated electrodes are all to be driven at the same potential, while the second electrode is to be driven at another potential, causing the device to produce a flexural mode of motion in the membrane.

24. The PMUT device of claim 21, further comprising an interior support structure disposed within the cavity and connected to the substrate and the membrane.

25. The PMUT device of claim 24, wherein the second electrode extends into the cavity and defines an area between the edge support structure and the interior support structure.

* * * * *